(12) United States Patent
Den Boer et al.

(10) Patent No.: US 10,082,920 B2
(45) Date of Patent: *Sep. 25, 2018

(54) TRANSPARENT CONDUCTIVE COATING FOR CAPACITIVE TOUCH PANEL OR THE LIKE

(71) Applicant: Guardian Glass, LLC, Auburn Hills, MI (US)

(72) Inventors: Willem Den Boer, Brighton, MI (US); Jian-gang Weng, Canton, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/409,658

(22) Filed: Jan. 19, 2017

(65) Prior Publication Data

US 2017/0139507 A1    May 18, 2017

Related U.S. Application Data

(63) Continuation of application No. 14/681,266, filed on Apr. 8, 2015, now Pat. No. 9,557,871.

(51) Int. Cl.
| | |
|---|---|
| *G06F 3/045* | (2006.01) |
| *G06F 3/044* | (2006.01) |
| *C03C 17/36* | (2006.01) |

(52) U.S. Cl.
CPC .......... *G06F 3/044* (2013.01); *C03C 17/3618* (2013.01); *C03C 17/3626* (2013.01);
(Continued)

(58) Field of Classification Search
CPC .................... G06F 3/041; G06F 3/044; G06F 2203/04103; G06F 2203/04111; C03C 17/2456; C03C 17/3435; C03C 17/3618; C03C 17/3642; C03C 17/3644; C03C 17/3655; C03C 2217/22; C03C 2217/74;
(Continued)

(56) References Cited

U.S. PATENT DOCUMENTS

| | | | |
|---|---|---|---|
| 5,254,413 A | 10/1993 | Maricocchi | |
| 5,688,585 A | 11/1997 | Lingle | |

(Continued)

FOREIGN PATENT DOCUMENTS

| | | |
|---|---|---|
| EP | 2 402 481 | 1/2012 |
| JP | 2010-157239 | 7/2010 |

(Continued)

OTHER PUBLICATIONS

U.S. Appl. No. 14/681,266, filed Apr. 8, 2015; Den Boer et al.

*Primary Examiner* — Joe H Cheng
(74) *Attorney, Agent, or Firm* — Nixon & Vanderhye P.C.

(57) ABSTRACT

This invention relates to a transparent conductive coating that is substantially transparent to visible light and is designed to have a visible reflectance which more closely matches that the visible reflectance of the underlying substrate. In certain example embodiments, the transparent conductive multilayer coating includes a silver layer(s) and may be used as an electrode(s) in a capacitive touch panel so as to provide for an electrode(s) transparent to visible light but without much visibility due to the substantial matching visible reflection design.

10 Claims, 15 Drawing Sheets

(52) U.S. Cl.
CPC ...... *C03C 17/3642* (2013.01); *C03C 17/3644* (2013.01); *C03C 17/3655* (2013.01); *C03C 17/3671* (2013.01); *C03C 2217/211* (2013.01); *C03C 2217/212* (2013.01); *C03C 2217/216* (2013.01); *C03C 2217/256* (2013.01); *C03C 2217/281* (2013.01); *C03C 2218/154* (2013.01); *G06F 2203/04103* (2013.01)

(58) Field of Classification Search
CPC .......... C03C 2217/94; C03C 2217/211; C03C 2217/212; C03C 2217/216; C03C 2217/231; C03C 2217/232; C03C 2217/256; C03C 2217/281; C03C 2217/944; C03C 2218/154; C03C 2218/365; C23C 14/0652; C23C 14/086; C23C 14/34; G02F 1/13338; B32B 17/10174; B32B 17/10229; H01L 31/02167

See application file for complete search history.

(56) References Cited

U.S. PATENT DOCUMENTS

| | | | |
|---|---|---|---|
| 6,262,842 | B1 | 7/2001 | Ouderkirk |
| 8,124,237 | B2 | 2/2012 | Nunez-Regueiro et al. |
| 8,138,425 | B2 | 3/2012 | Lee et al. |
| 8,173,263 | B2 | 5/2012 | Lingle et al. |
| 8,187,713 | B2 | 5/2012 | Lemmer et al. |
| 8,202,619 | B2 | 6/2012 | Thomsen et al. |
| 8,203,073 | B2 | 6/2012 | Lu et al. |
| 8,263,227 | B2 | 9/2012 | Disteldorf et al. |
| 8,293,344 | B2 | 10/2012 | Lemmer et al. |
| 8,313,620 | B2 | 11/2012 | Krasnov |
| 8,895,149 | B2 | 11/2014 | Imran |
| 9,557,871 | B2 | 1/2017 | Den Boer et al. |
| 9,740,357 | B2 * | 8/2017 | Den Boer ............... G06F 3/044 |
| 2002/0071075 | A1 | 6/2002 | Ogino |
| 2002/0122962 | A1 | 9/2002 | Arfsten |
| 2004/0086723 | A1 | 5/2004 | Thomsen et al. |
| 2004/0095645 | A1 | 5/2004 | Pellicori |
| 2006/0204655 | A1 | 9/2006 | Takahashi |
| 2007/0236618 | A1 | 10/2007 | Maag |
| 2009/0084438 | A1 | 4/2009 | Den Boer |
| 2009/0155619 | A1 | 6/2009 | Nelson |
| 2009/0194157 | A1 | 8/2009 | Den Boer |
| 2009/0314621 | A1 | 12/2009 | Hotelling |
| 2010/0013784 | A1 | 1/2010 | Nashiki et al. |
| 2010/0046191 | A1 | 2/2010 | den Boer et al. |
| 2010/0163994 | A1 | 7/2010 | Tang et al. |
| 2011/0193799 | A1 | 8/2011 | Jun et al. |
| 2012/0080090 | A1 | 4/2012 | Thomsen |
| 2012/0114919 | A1 | 5/2012 | Nakajima et al. |
| 2012/0219821 | A1 | 8/2012 | Frank et al. |
| 2013/0004678 | A1 | 1/2013 | Krasnov et al. |
| 2013/0050149 | A1 | 2/2013 | Rattray |
| 2013/0308192 | A1 | 11/2013 | Shimoda |
| 2014/0092028 | A1 | 4/2014 | Prest et al. |
| 2014/0092324 | A1 | 4/2014 | Kim et al. |
| 2014/0145999 | A1 | 5/2014 | den Boer et al. |
| 2015/0036066 | A1 | 2/2015 | Chan et al. |
| 2015/0274584 | A1 | 10/2015 | Kleinhempel |
| 2016/0124120 | A1 | 5/2016 | Varanasi |
| 2016/0207826 | A1 * | 7/2016 | Kim .......................... C09D 1/00 |
| 2016/0253004 | A1 | 9/2016 | Den Boer |
| 2016/0328053 | A1 * | 11/2016 | Veerasamy ............. G06F 3/044 |
| 2017/0315637 | A1 * | 11/2017 | Veerasamy ............. G06F 3/044 |
| 2017/0315638 | A1 * | 11/2017 | Den Boer ............ G06F 3/0412 |
| 2017/0344157 | A1 * | 11/2017 | Krasnov ................. G06F 3/044 |

FOREIGN PATENT DOCUMENTS

| | | |
|---|---|---|
| JP | 2012-133779 | 7/2012 |
| WO | WO 2012/099253 | 7/2012 |
| WO | WO 2012/099394 | 7/2012 |

\* cited by examiner

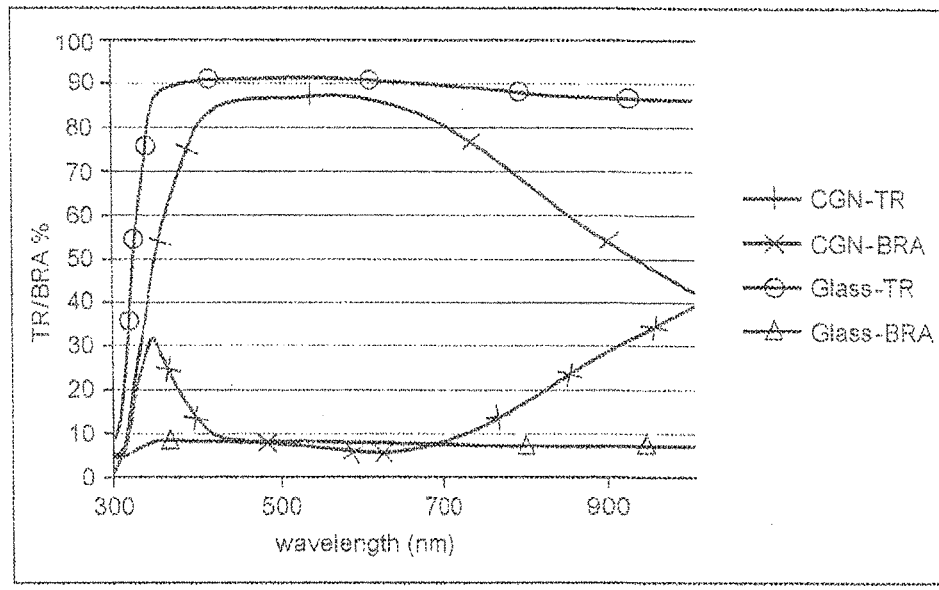
FIG. 5 (Comparative Example)
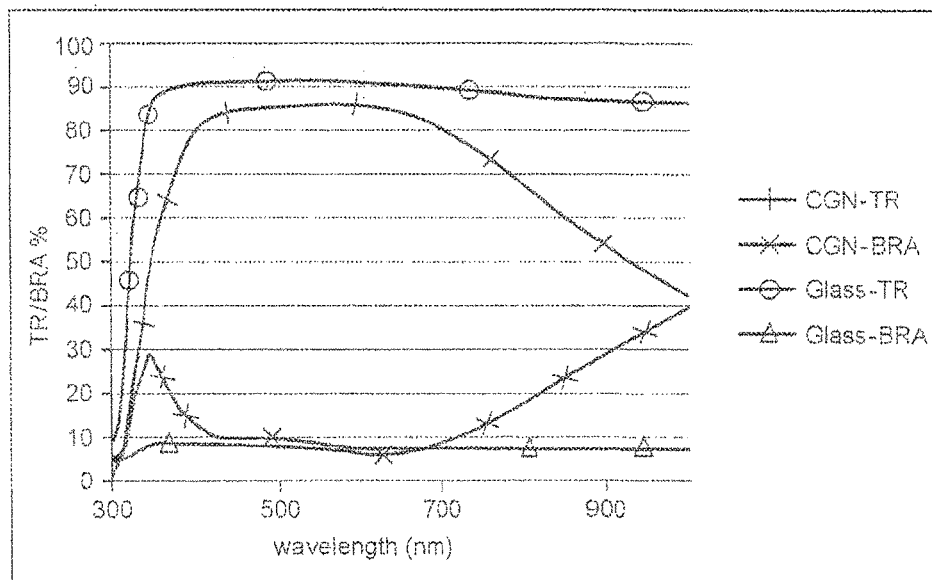
FIG. 6 (Example 1)

TRANSPARENT CONDUCTIVE COATING FOR CAPACITIVE TOUCH PANEL OR THE LIKE

This application is a continuation of application Ser. No. 14/681,266, filed Apr. 8, 2015 (now U.S. Pat. No. 9,557,871), the entire disclosure of which is hereby incorporated herein by reference in this application.

Example embodiments of this invention relates to a transparent conductive coating that is substantially transparent to visible light and is designed to have visible reflectance (glass side and/or film side visible reflectance) that is more closely matched to the visible reflectance of the underlying substrate in areas where the coating is not present. In certain example embodiments, the coating includes a silver layer(s) and may be used as an electrode(s) in a capacitive touch panel so as to provide for an electrode(s) transparent to visible light but without much visibility due to the more closely matching visible reflection of the coating on the substrate to that of an underlying substrate in areas where the coating is not present. The coating also has improved conductivity (e.g., smaller sheet resistance $R_s$ or smaller emissivity, given a similar thickness and/or cost of deposition) compared to typical ITO coatings. The coating may also be used as a low-emissivity (low-E) coating, for reflecting infrared (IR) radiation, in windows and the like.

BACKGROUND

A capacitive touch panel often includes an insulator such as glass, coated with a conductive coating. As the human body is also an electrical conductor, touching the surface of the panel results in a distortion of the panel's electrostatic field, measurable as a change in capacitance. A transparent touch panel may be combined with a display such as a liquid crystal display (LCD) panel to form a touchscreen. A projected capacitive (PROCAP) touch panel, which may optionally include an LCD or other display, allows finger or other touches to be sensed through a protective layer(s) in front of the conductive coating. The protective layer increases durability, while the ability to sense touches through an insulator allows a user to operate the touch panel while wearing gloves. Certain example embodiments of this invention are related to PROCAP touch panels.

FIGS. 1(a) to 1(g) illustrate an example of a related art projected capacitive touch panel, e.g., see U.S. Pat. No. 8,138,425 the disclosure of which is hereby incorporated herein by reference. See U.S. 2014/0145999 which published May 29, 2014, and is commonly owned with this invention.

Referring to FIG. 1(a), substrate 11, x-axis conductor 12 for rows, insulator 13, y-axis conductor 14 for columns, and conductive traces 15 are provided. Substrate 11 may be a transparent material such as glass. X-axis conductors 12 and y-axis conductors 14 are typically indium tin oxide (ITO) which is a transparent conductor. Insulator 13 may be an insulating material (for example, silicon nitride) which inhibits conductivity between x-axis conductors 12 and y-axis conductors 14. Traces 15 provide electrical conductivity between the plurality of conductors and a signal processor (not shown). ITO used for electrodes/traces in small PROCAP touch panels typically has a sheet resistance of at least about 100 ohms/square, which has been found to be too high for certain applications as discussed here.

Referring to FIG. 1(b), x-axis conductor 12 (e.g., ITO) is formed on substrate 11. The ITO is coated in a continuous layer on substrate 11 and then is subjected to a first photolithography process in order to pattern the ITO into x-axis conductors 12. FIG. 1(c) illustrates cross section A-A' of FIG. 1(b), including x-axis conductor 12 formed on substrate 11. Referring to FIG. 1(d), insulator 13 is then formed on the substrate 11 over x-axis channel(s) of x-axis conductor 12. FIG. 1(e) illustrates cross section B-B' of FIG. 1(d), including insulator 13 which is formed on substrate 11 and x-axis conductor 12. The insulator islands 13 shown in FIGS. 1(d)-(e) are formed by depositing a continuous layer of insulating material (e.g., silicon nitride) on the substrate 11 over the conductors 12, and then subjecting the insulating material to a second photolithography, etching, or other patterning process in order to pattern the insulating material into islands 13. Referring to FIG. 1(f), y-axis conductors 14 are then formed on the substrate over the insulator islands 13 and x-axis conductors 12. The ITO for y-axis conductors 14 is coated on substrate 11 over 12, 13, and then is subjected to a third photolithography or other patterning process in order to pattern the ITO into y-axis conductors 14. While much of y-axis conductor material 14 is formed directly on substrate 11, the y-axis channel is formed on insulator 13 to inhibit conductivity between x-axis conductors 12 and y-axis conductors 14. FIG. 1(g) illustrates cross section C-C' of FIG. 1(f), including part of an ITO y-axis conductor 14, which is formed on the substrate 11 over insulator island 13 and over an example ITO x-axis conductor 12. It will be appreciated that the process of manufacturing the structure shown in FIGS. 1(a)-(g) requires three separate and distinct deposition steps and three photolithography type processes, which renders the process of manufacture burdensome, inefficient, and costly.

FIG. 1(h) illustrates another example of an intersection of ITO x-axis conductor 12 and ITO y-axis conductor 14 according to a related art projected capacitive touch panel. Referring to FIG. 1(h), an ITO layer is formed on the substrate 11 and can then be patterned into x-axis conductors 12 and y-axis conductors 14 in a first photolithography process. Then, an insulating layer is formed on the substrate and is patterned into insulator islands 13 in a second photolithography or etching process. Then, a conductive layer is formed on the substrate 11 over 12-14 and is patterned into conductive bridges 16 in a third photolithography process. Bridge 16 provides electrical conductivity for a y-axis conductor 14 over an x-axis conductor 12. Again, this process of manufacture requires three deposition steps and three different photolithography processes.

The projected capacitive touch panels illustrated in FIGS. 1(a) through 1(h) may be mutual capacitive devices or self-capacitive devices. In a mutual capacitive device, there is a capacitor at every intersection between an x-axis conductor 12 and a y-axis conductor 14 (or metal bridge 16). A voltage is applied to x-axis conductors 12 while the voltage of y-axis conductors 14 is measured (and/or vice versa). When a user brings a finger or conductive stylus close to the surface of the device, changes in the local electrostatic field reduce the mutual capacitance. The capacitance change at every individual point on the grid can be measured to accurately determine the touch location. In a self-capacitive device, the x-axis conductors 12 and y-axis conductors 14 operate essentially independently. With self-capacitance, the capacitive load of a finger or the like is measured on each x-axis conductor 12 and y-axis conductor 14 by a current meter.

As described above, prior art transparent conductors 12 and 14 are typically indium tin oxide (ITO), which is problematic for a number of reasons. First, ITO is costly. Second, thin layers of ITO also have a high sheet resistance $R_s$ (at least about 100 ohms/square); in other words the conductivity of ITO is not particularly good and its resistivity is high. In order for an ITO layer to have a sheet resistance less than 5 ohms/square, the ITO layer must be thick (for example, greater than 400 nm). However, a thick layer of ITO is both prohibitively expensive and less transparent. Thus, the high sheet resistance of thin layers of ITO limits their use in layouts requiring long narrow traces on touch panels, with an emphasis on large panels. Accordingly, it will be appreciated that there exists a need in the art for touch panel electrodes that are of material which does not suffer from the ITO disadvantage combination of high cost and low conductivity at small thickness.

Recognizing the flaws of ITO as an electrode material in touch panels, US 2014/0145999 discloses the use of a silver based coating to replace the ITO. The silver based coating is more conductive than is ITO for a given thickness, and can be deposited in a suitable manner at a lower cost. However, a problem has been found to exist with respect to the coatings of US 2014/0145999. In particular, if the coatings of US 2014/0145999 are used as electrodes on a touch panel, they are highly visible to users due to the fact that the visible reflectance is the coated areas is much different than the visible reflectance of the glass substrate in the non-coated areas. In other words, the visible reflectance difference is too high between (a) the underlying glass substrate alone in areas where the coating is not present, and (b) coated areas having the coating on the glass substrate. Thus, a need in the art exists for a transparent conductive coating that is both highly conductive at a reasonable deposition cost and which has reduced visibility compared to the conductive coatings of US 2014/0145999.

SUMMARY OF EXAMPLE EMBODIMENTS

Example embodiments of this invention relate to a transparent conductive coating that is both highly conductive at a reasonable deposition cost and which has reduced visibility on a glass substrate compared to the conductive coatings of US 2014/0145999. The coating may be used as electrode layers and/or traces in capacitive touch panels such as PROCAP touch panel, and/or may be used as a low-E coating in applications other than touch panels such as in windows. The coating may have a silver-inclusive layer(s) that may be sandwiched between at least first and second dielectric layers. The coating has been designed so as to surprisingly result in a visible reflectance that more closely matches visible reflectance of the underlying glass substrate so that the coating (e.g., electrodes and traces) is less visible to users of touch panels or the like compared to coatings of US 2014/0145999.

In certain example embodiments of this invention, there is provided a capacitive touch panel, comprising: a substrate; a multi-layer transparent conductive coating supported by the substrate, wherein the multi-layer transparent conductive coating comprises at least one conductive layer comprising silver located between at least a first dielectric layer and a second dielectric layer, wherein the multi-layer transparent conductive coating, comprising at least the conductive layer comprising silver located between at least the first dielectric layer and the second dielectric, is patterned into a plurality of electrodes for the touch panel; a processor which measures capacitance between electrodes in detecting touch position on the touch panel, wherein the electrodes formed from the multi-layer transparent conductive coating are formed substantially in a common plane substantially parallel to the substrate, and wherein there is no more than a 2.0 (more preferably no more than 1.5, and most preferably no more than 1.0) difference at a visible wavelength 600 nm (or in the visible spectrum range from 550-600 nm) between (a) a glass side and/or film side visible reflectance percentage of the multi-layer transparent conductive coating on the substrate in areas where the coating is present, and (b) a visible reflectance percentage of the substrate in at least some areas where the multi-layer transparent conductive coating is not present.

In the capacitive touch panel of the immediately preceding paragraph, the substrate may be a glass substrate or a substrate made up of glass coated with an antireflective (AR) coating.

In the capacitive touch panel of any of the preceding two paragraphs, the first dielectric layer may comprises titanium oxide and/or the second dielectric layer may comprise tin oxide.

In the capacitive touch panel of any of the preceding three paragraphs, the multi-layer transparent conductive coating may have a sheet resistance of less than or equal to about 15 ohms/square, more preferably less than or equal to about 10 ohms/square, and most preferably less than or equal to about 5 ohms/square.

The capacitive touch panel of any of the preceding four paragraphs may be coupled to a liquid crystal (LC) panel, the LC panel including a pair of substrates with a liquid crystal layer provided therebetween, and wherein the multi-layer transparent conductive coating is provided between the substrate which supports the coating and the LC panel, and wherein the multi-layer transparent conductive coating is adjacent an air gap that is provided between the LC panel and the multi-layer transparent conductive coating.

BRIEF DESCRIPTION OF THE DRAWINGS

FIG. 5 is a percent visible transmission/reflectance vs. wavelength (nm) graph illustrating the visible transmission (TR) percentage and glass side visible reflection (BRA) percentage of the Comparative Example (CE) coating on a glass substrate, compared to those values for the glass substrate alone (Glass-TR, Glass-BRA).

FIG. 6 is a percent visible transmission/reflectance vs. wavelength (nm) graph illustrating the visible transmission (TR) and glass side visible reflection (BRA) of an example coating of FIG. 4(a) according to an example embodiment of this invention on a glass substrate, demonstrating that it is transparent to visible light and has glass side visible reflectance more closely matched to that of the glass substrate compared to the CE in FIG. 5. FIG. 6, like FIG. 5, also illustrates the visible transmission (Glass-TR) and visible reflectance (Glass-BRA) for the glass substrate alone without the coating on it.

FIG. 8(a) also illustrates the visible transmission (Glass-TR) and visible reflectance (Glass-BRA) for just the glass substrate absent the coating.

DETAILED DESCRIPTION OF EXEMPLARY EMBODIMENTS

Figure 1A:
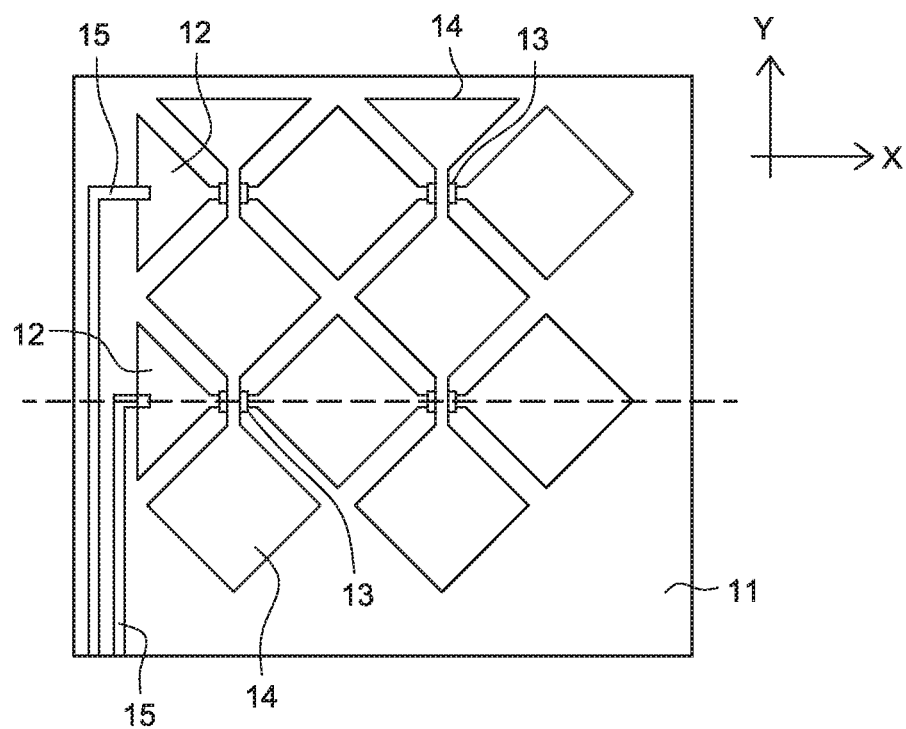
FIGS. 1(a) to 1(h) illustrate examples of prior art projected capacitive touch panels.
Figure 1B:
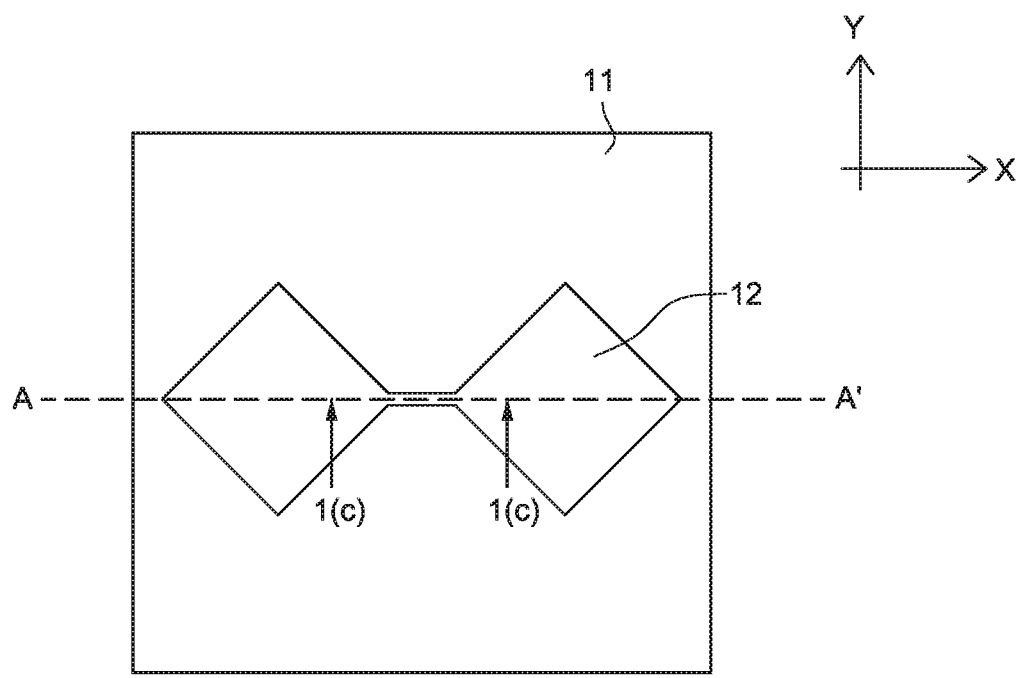
Figure 1C:
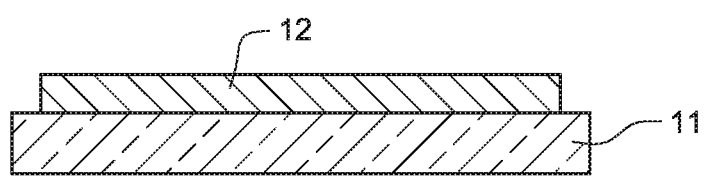
Figure 1D:
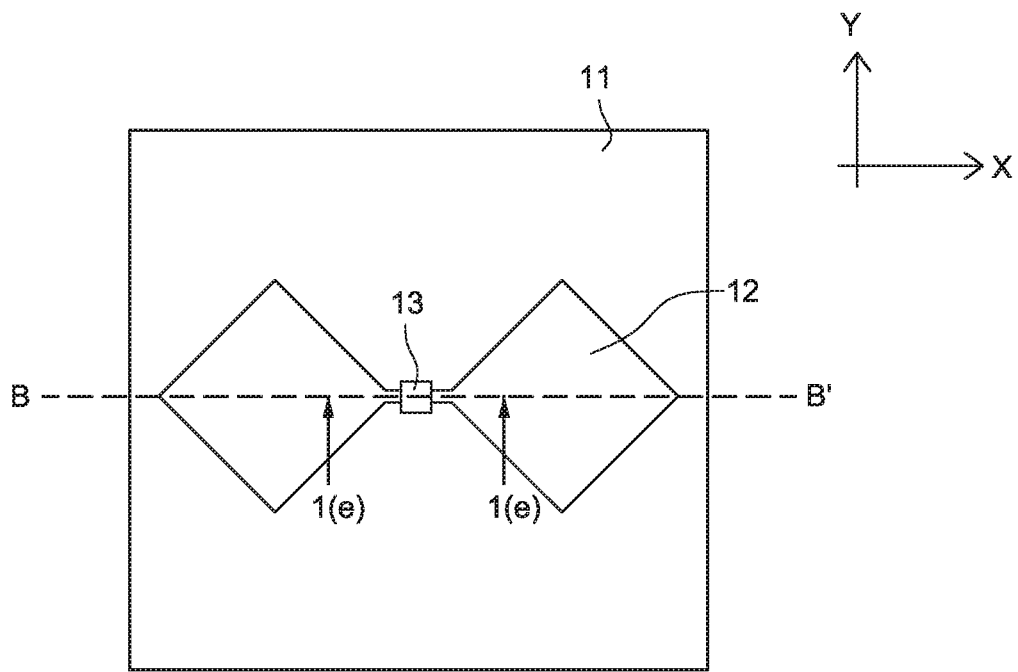
Figure 1E:
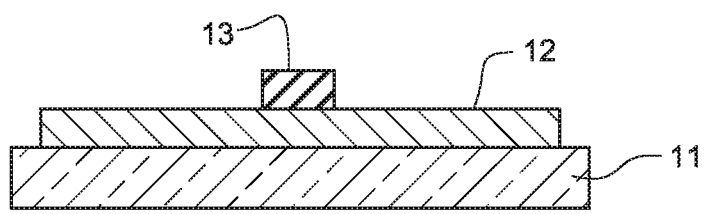
Figure 1F:
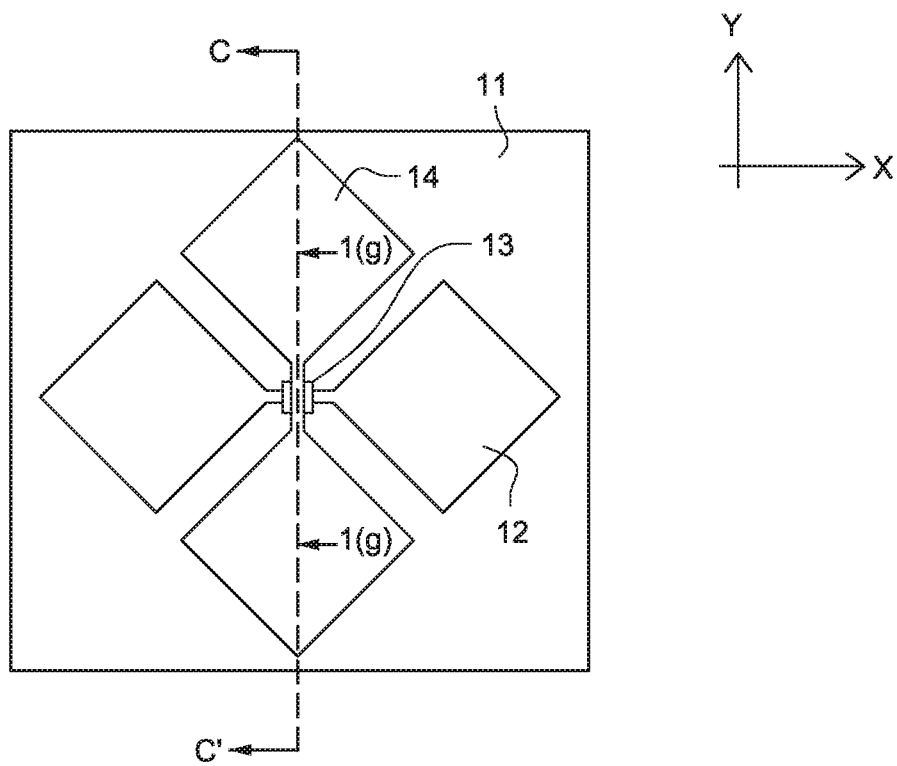
Figure 1G:
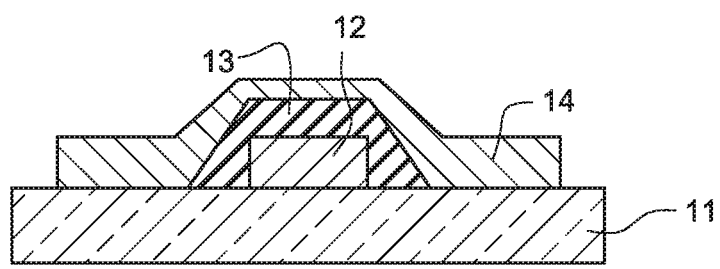
Figure 1H:
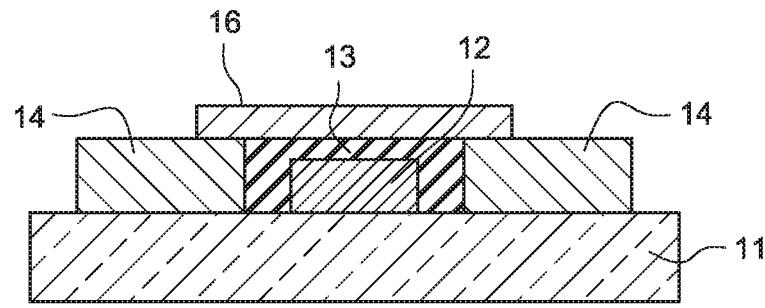

A detailed description of exemplary embodiments is provided with reference to the accompanying drawings. Like reference numerals indicate like parts throughout the drawings.

Example embodiments of this invention relate to a transparent conductive coating 41 that is both highly conductive at a reasonable deposition cost and which has reduced visibility on a glass substrate 40 compared to the conductive coatings of US 2014/0145999. The coating 41 may be used as electrode layers and/or traces in capacitive touch panels such as PROCAP touch panel, and/or may be used as a low-E coating in applications other than touch panels such as in windows for reflecting IR radiation. The coating 41 may have a silver-inclusive layer that may be sandwiched between at least first and second dielectric layers. The coating 41 has been designed so as to surprisingly result in a visible reflectance (e.g., glass side visible reflectance) that more closely matches visible reflectance of the underlying glass substrate in areas where the coating is not present so that the coating when patterned on the glass substrate (e.g., electrodes and traces) is less visible to users of touch panels or the like compared to coatings of US 2014/0145999, which is particularly important in applications such as touch panels where the coating 41 is patterned into only certain areas of an underlying substrate (e.g., glass substrate 40).

Figure 2A:
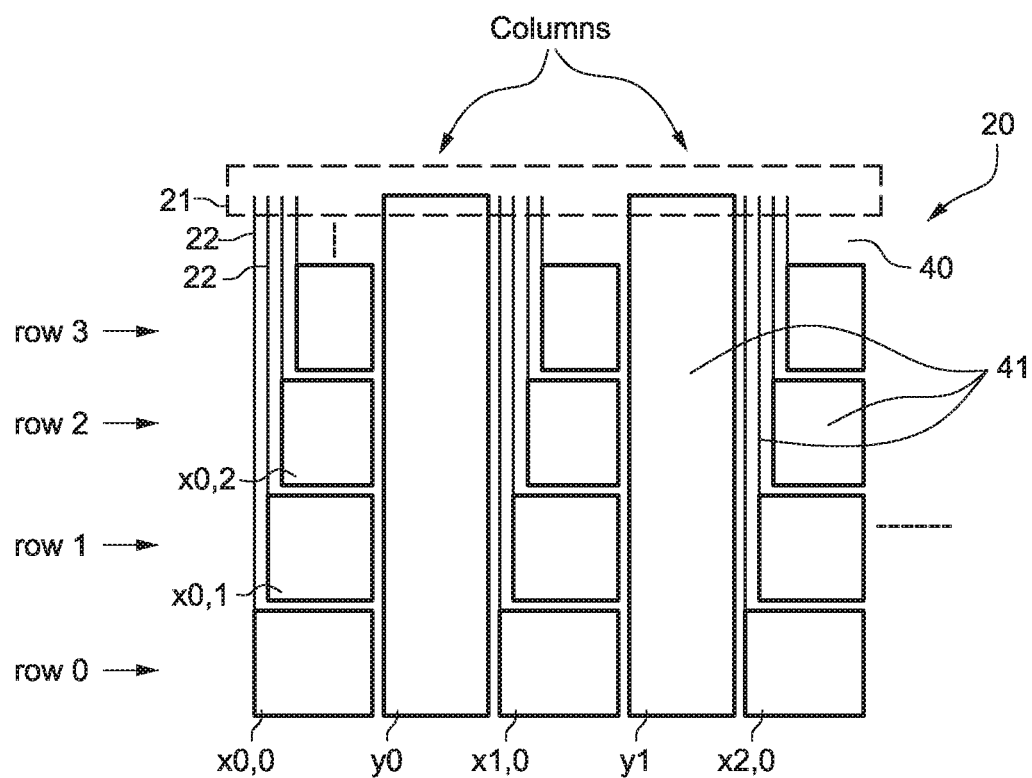
FIG. 2(a) illustrates a top or bottom plan layout of a projected capacitive touch panel according to an exemplary embodiment, that may contain the coating(s) of FIGS. 4, 6, 7, and/or 8 as conductive electrode(s) and/or conductive trace(s).
Figure 7:
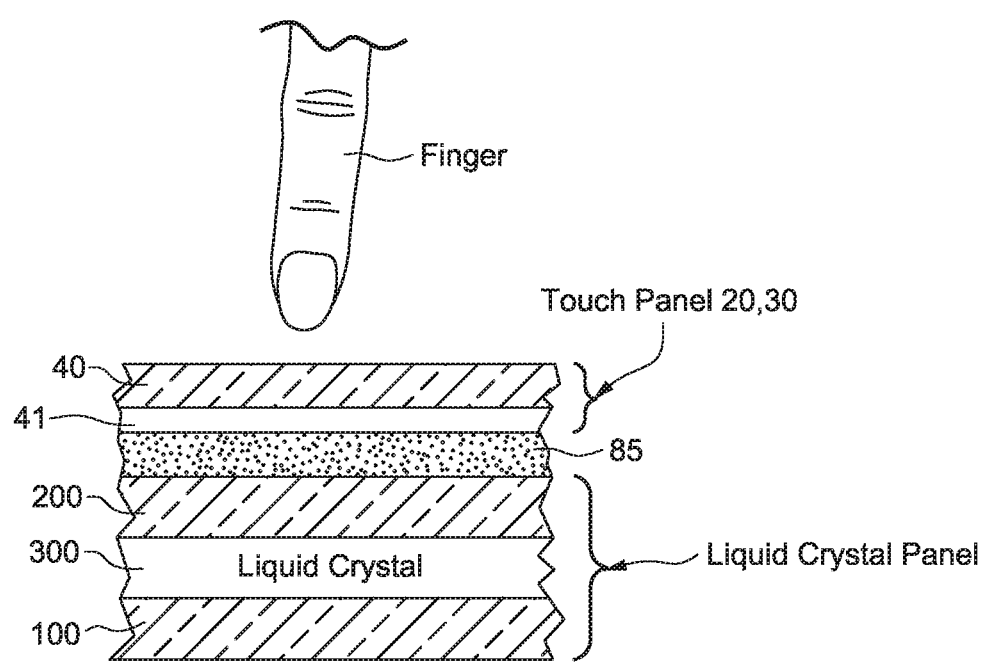
FIG. 7 is a cross sectional view of a touch panel assembly according to an example embodiment of this invention, including a touch panel according to any of FIGS. 2-4, 6, 8-10 coupled to a liquid crystal panel, for use in electronic devices such as portable phones, portable pads, computers, and/or so forth.
Figure 8:
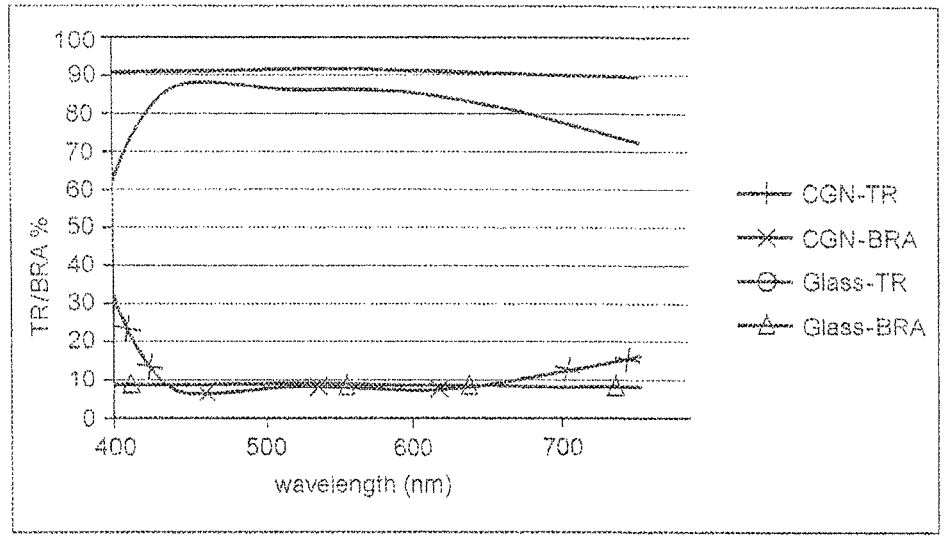
FIG. 8(a) is a percent visible transmission/reflectance vs. wavelength (nm) graph illustrating the visible transmission (CGN-TR or TR) and glass side visible reflection (CGN-BRA or BRA) of an example coating of FIG. 4(b) according to another example embodiment of this invention, demonstrating that it is transparent to visible light and has a glass side visible reflectance more closely matched to the reflectance of the glass substrate alone compared to the CE.
FIG. 8(b) is a percent visible transmission/reflectance vs. wavelength (nm) graph illustrating the visible transmission (CGN-TR or TR) and glass side visible reflection (CGN-BRA or BRA) of an example coating of FIG. 4(c) according to another example embodiment of this invention, demonstrating that it is transparent to visible light and has a glass side visible reflectance more closely matched to the reflectance of the substrate compared to the CE.
Figure 8:
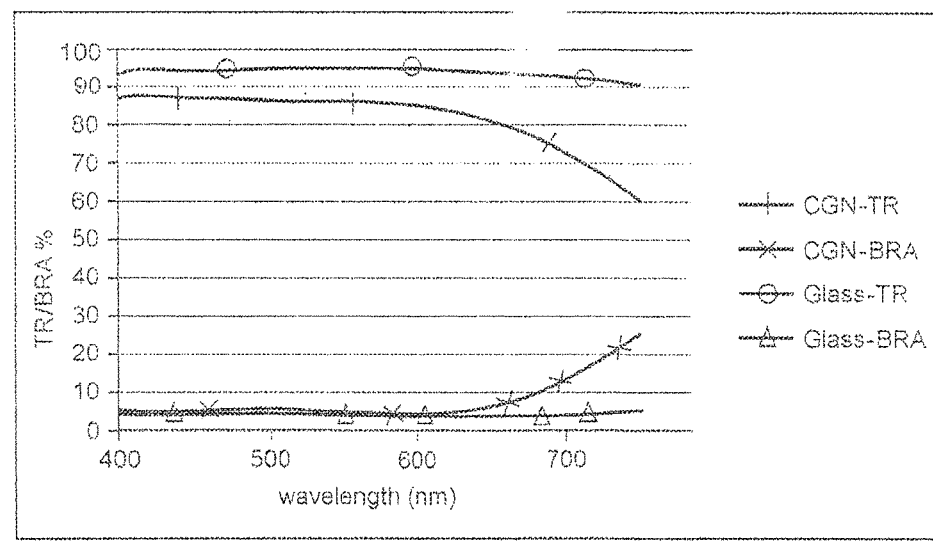

FIG. 2(a) illustrates a top or bottom plan layout of a projected capacitive touch panel according to an exemplary embodiment, that may contain the multi-layer conductive transparent coating 41 of FIGS. 4, 6, 7, and/or 8 as conductive electrode(s) x, y and/or conductive trace(s) 22. Referring to FIG. 2(a), touch panel 20 is provided. Touch panel 20 includes a matrix of electrodes x, y including n columns and m rows, provided on a substrate 40. The matrix of row/column electrodes x, y is typically provided on the side of the substrate (e.g., glass substrate 40) that is opposite the side touched by person(s) using the touch panel, in order to prevent corrosion of the silver-based coating 41 by human finger touches. In other words, when the touch panel is touched by a finger, stylus, or the like, the glass substrate 40 is typically located between (a) the finger and (b) the matrix of row/column electrodes x, y and conductive traces 22. Change in capacitance between adjacent row and column electrodes in the matrix as a result of the proximity of a finger or the like is sensed by the electronic circuitry, and the connected circuitry can thus detect where the panel is being touched by a finger or the like. For example, referring to FIG. 2(a), row 0 includes row electrodes $x_{0,0}$, $x_{1,0}$, $x_{2,0}$, etc., through $x_{n,0}$ and columns 0, 1 and 2 respectively include column electrodes $y_0$, $y_1$, $y_2$, etc., through $y_n$. Optionally, the x electrodes in a column direction may also be grouped for column sensing. The number of row and column electrodes is determined by the size and resolution of the touch panel. In this example, the top-right row electrode is $x_{n,m}$. Each row electrode $x_{0,0}$-$x_{n,m}$ of touch panel 20 is electrically connected to interconnect area 21 and corresponding processing circuitry/software by a conductive trace 22. Each column electrode $y_0$-$y_n$ is also electrically connected to interconnect area 21 and corresponding processing circuitry/software, either directly or by a conductive trace. The conductive traces 22 are preferably formed of the same transparent conductive material (multilayer conductive transparent coating 41) as the row and column electrodes (e.g, same material as at least row electrodes $x_{0,0}$, $x_{1,0}$, $x_{2,0}$, etc.). Thus, in certain example embodiments, the matrix of row and column electrodes x, y and corresponding traces 22 can be formed on the substrate (e.g., glass substrate) 40 by forming the coating 41 (e.g., by sputter-depositing the coating 41) on the substrate and by performing only one (or maximum two) photolithography process in order to pattern the coating 41 into the electrodes x, y and traces 22. In certain example embodiments, the silver-inclusive coating (e.g., see example coating 41 in FIG. 4) is sputter deposited on the glass substrate 40 and is then subjected to photolithography and/or laser patterning to pattern the silver-inclusive coating into traces 22, row electrodes $x_{0,0}$, $x_{1,0}$, $x_{2,0}$, $x_{0,1}$, $x_{,0,\,2}$, $x_{0,3}$, etc. through $x_{n,m}$, and column electrodes $y_0$-$y_n$. Because the row electrodes $x_{0,0}$-$x_{n,m}$, column electrodes $y_0$-$y_n$, and traces 22 do not overlap as viewed from above/below, the row electrodes $x_{0,0}$-$x_{n,m}$, column electrodes $y_0$-$y_n$, and traces 22 may be formed on the same plane parallel (or substantially parallel) to glass substrate 40 on which the electrodes and traces are formed. And no insulating layer between electrodes x and y is needed in certain example embodiments. Significant portions of traces 22 may also be parallel (or substantially parallel) to the column electrodes in the plane parallel (or substantially parallel) to the substrate 40. Accordingly, touch panel 20 may be made via a smaller number of photolithography or laser patterning steps while achieving traces that achieve sufficient transparency and conductivity, thereby reducing production costs and resulting in a more efficient touch panel for use in a display assembly or the like.

Figure 2B:
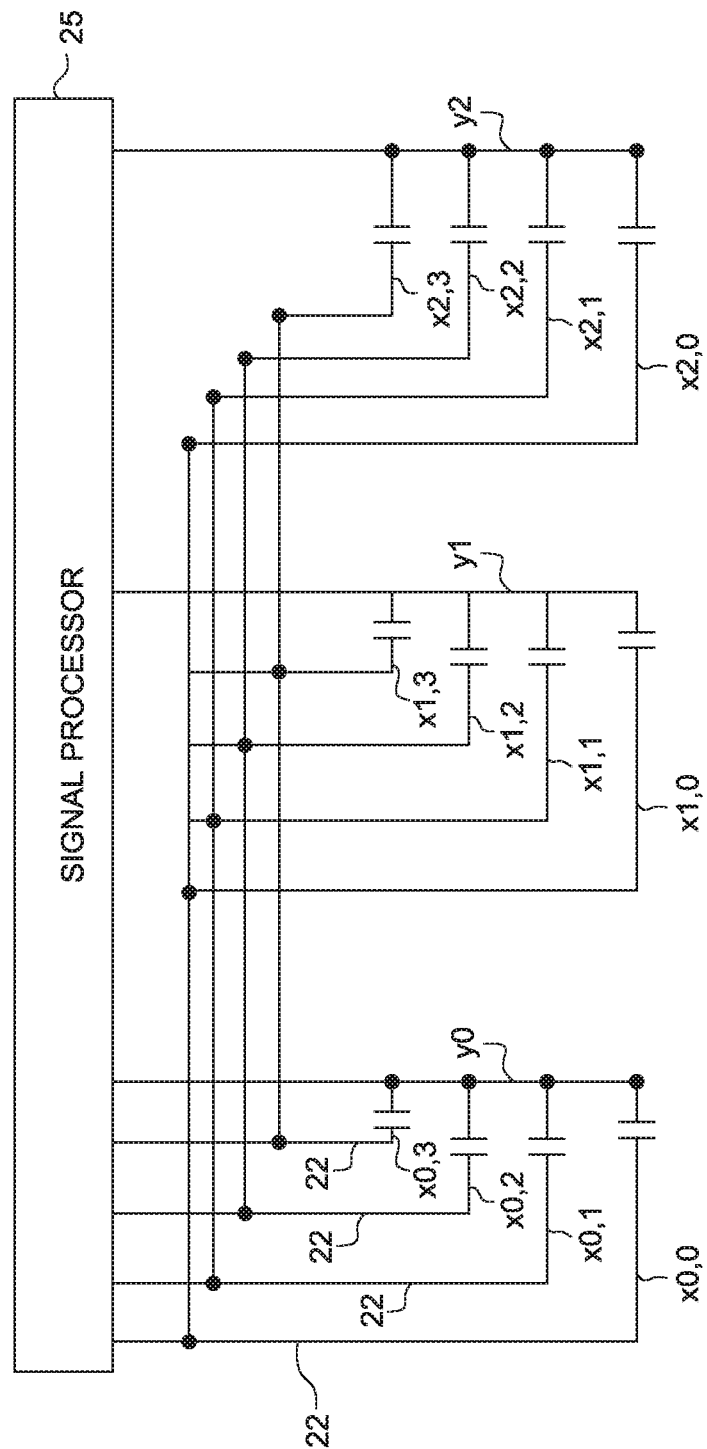
FIG. 2(b) illustrates a schematic representation of circuitry for the projected capacitive touch panel of FIG. 2(a), 3, 9, and/or 10.

FIG. 2(b) illustrates a schematic representation of circuitry for the touch panel 20 illustrated in FIG. 2(a), according to exemplary embodiments. In touch panel 20, there is a capacitance between each row electrode and the adjacent column electrode (for example, between row electrode $x_{0,0}$ and column electrode $y_0$). This capacitance can be measured by applying a voltage to a column electrode (for example, column electrode $y_0$) and measuring the voltage of an adjacent row electrode (for example, row electrode $x_{0,0}$). When a user brings a finger or conductive stylus close to touch panel 20, changes in the local electrostatic field reduce the mutual capacitance. The capacitance change at individual points on the surface can be measured by measuring each pair of row electrodes and column electrodes in sequence. The traces 22 of each row electrode in the same row (for example, the traces 22 of row electrodes $x_{0,0}$, $x_{1,0}$, $x_{2,0}$, etc., through $x_{n,0}$ of row 0) may be electrically connected together (as shown in FIG. 2(b)). The interconnection of the first row segments to each other, second row segments to each other, etc., may be made on a flexible circuit(s) attached at the periphery of the touch panel in the interconnection area, so that no cross-overs are needed on the glass substrate 40. In that instance, a voltage is applied to a column electrode and the voltage of each row is measured in sequence before the process is repeated with a voltage applied to another column. Alternatively, each trace 22 may be connected to signal processor 25 and the voltage of each trace 22 may be measured individually. The same capacitance may be measured by applying a voltage to a row electrode and measuring the voltage on an adjacent column electrode rather than applying a voltage to a column electrode and measuring the voltage of an adjacent row electrode. Signal processing (for example, applying and measuring voltages, measuring the capacitance between adjacent electrodes, measuring changes in capacitance over time, outputting signals in response to user inputs, etc.) may be performed by signal processor 25. Signal processor 25 may be one or more hardware processors, may include volatile or non-volatile memory, and may include computer-readable instructions for executing the signal processing. Signal processor 25 is electrically connected to the column electrodes $y_0$-$y_n$ and electrically connected to the row electrodes $x_{0,0}$-$x_{n,m}$ through the traces 22. Signal processor 25 may or may not be located on the same plane as row electrodes $x_{0,0}$-$x_{n,m}$, column electrodes $y_0$-$y_n$, and traces 22 (for example, in interconnect area 21 of FIG. 2(a)).

Figure 3:
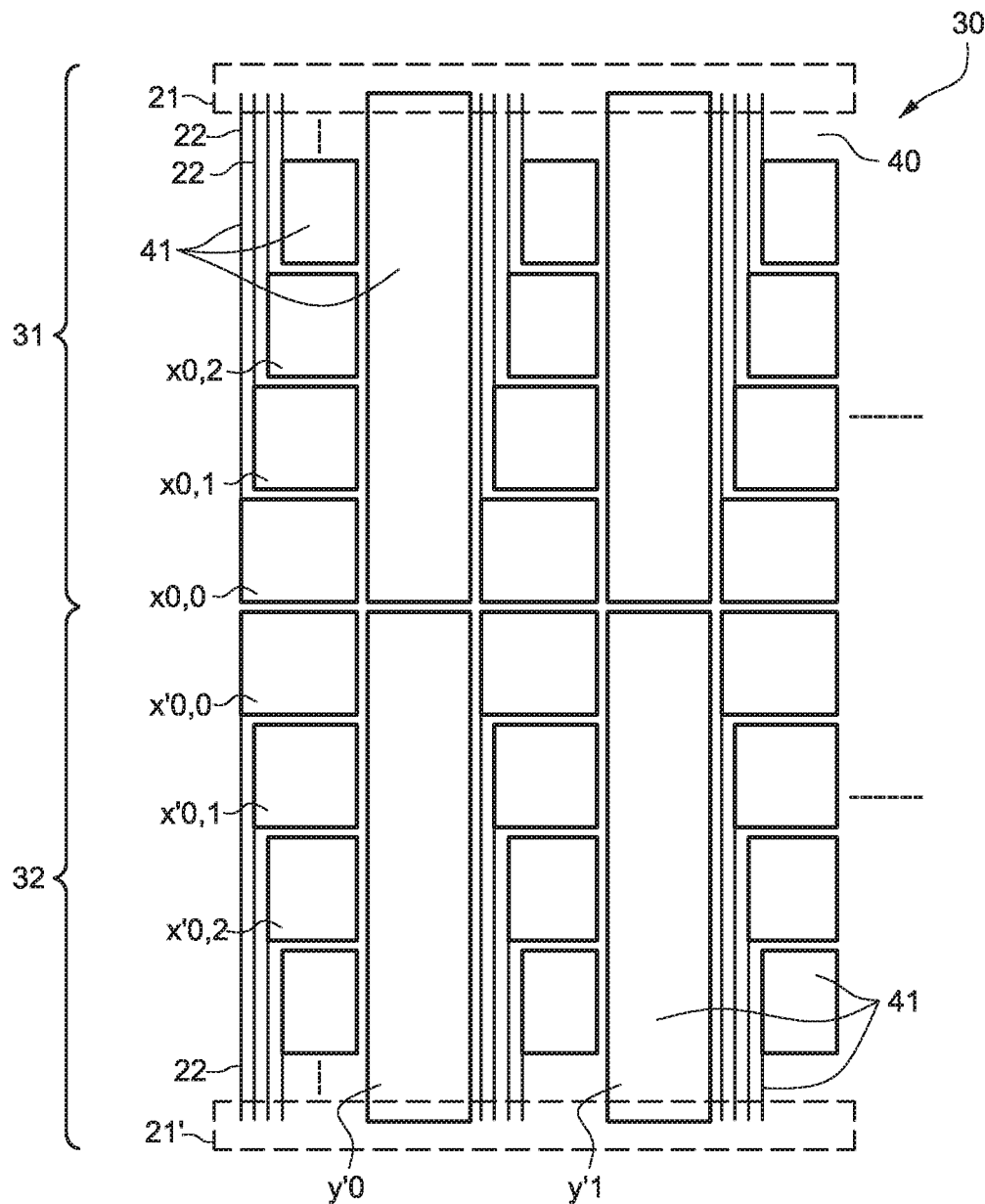
FIG. 3 illustrates a top or bottom plan layout of a projected capacitive touch panel according to another example embodiment, that may contain the coating(s) of FIGS. 4, 6, 7, and/or 8 as conductive electrode(s) and/or conductive trace(s).

FIG. 3 illustrates a top or bottom plan layout of a projected capacitive touch panel according to another example embodiment, that includes the coating 41 of FIGS. 4, 6, 7, and/or 8 patterned to form the conductive electrode(s) x, y and/or conductive trace(s) 22. Referring to FIG. 3, touch panel 30 is similar to touch panel 20 of FIG. 2(a), except that touch panel 30 is divided into upper section 31 and lower section 32, each of which includes a matrix of electrodes x, y including n columns and m rows. For example, row 0 of upper section 31 includes row electrodes $x_{0,0}$, $x_{1,0}$, $x_{2,0}$, etc., through $x_{n,0}$. Upper section 31 also includes column electrodes $y_0$, $y_1$, $y_2$, etc., through $y_n$. Likewise, lower section 32 would also include row electrodes, and column electrodes $y_0$-$y_n$ that may be electrically separate from the column electrodes $y_0$-$y_n$ of the upper section 31. Thus, lower section 32 also includes a matrix of row electrodes including n columns and m rows, and n column electrodes. Lower section 32 may have more or less rows than upper section 31 in different example embodiments. The number of row and column electrodes of touch panel 30 is determined by the size and resolution of the touch panel. Each column electrode of upper section 31 is electrically connected to interconnect area 21, and each row electrode of upper section 31 is electrically connected to interconnect area 21 by a trace 22. As with the FIG. 2 embodiment, traces may or may not be used for connecting the column electrodes of upper section 31 to the interconnect area. Each column electrode of lower section 32 is electrically connected to interconnect area 21' and each row electrode of lower section 32 is electrically connected to interconnect area 21' by a trace 22. Again, traces may or may not be used for connecting the column electrodes of the lower section 32 to the interconnect area 21'. Still referring to FIG. 3, touch panel 30 is similar to touch panel 20 in that there is a capacitance between each row electrode and the adjacent column electrode which may be measured by applying a voltage to a column electrode and measuring the voltage of an adjacent row electrode (or, alternatively, by applying a voltage to a row electrode and measuring the voltage of an adjacent column electrode). When a user brings a finger or conductive stylus close to touch panel 30, changes in the local electrostatic field reduce the mutual capacitance. The capacitance change at individual points on the surface can be measured by measuring the mutual capacitance of each pair of row electrodes and column electrodes in sequence. Because the row electrodes and column electrodes x, y illustrated in FIG. 3 do not overlap, the row electrodes and column electrodes may be formed on the same plane by patterned transparent conductive coating 41, in the manner explained above in connection with FIG. 2. Accordingly, electrode structure x, y for the touch panel 30 may be thin in nature and may be patterned with one process (for example, one photolithography process or one laser patterning process) which reduces the production cost of the projected capacitive touch panel.

As one of ordinary skill in the art would recognize, touch panels 20 and 30 described are not limited to the orientation described above and shown in FIGS. 2-3. In other words, the terms "row," "column" "x-axis," and y-axis" as used in this application are not meant to imply a specific direction. Touch panel 20 of FIG. 2(a), for example, may be modified or rotated such that interconnect area 21 is located in any part of touch panel 20.

As illustrated in FIGS. 2(a) and 3, narrow transparent conductive traces 22 are routed to electrically connect electrodes to interconnect area 21 (and interconnect area 21'). Because of the large resistance of the narrow ITO traces, narrow ITO traces may only been used in small touch panels, such as for smart phones. To use one of the layouts illustrated in FIGS. 2(a) and 3 on larger touch panels (for example, measuring more than 10 inches diagonally) or otherwise, a transparent conductive coating 41 with low sheet resistance is used. The silver inclusive coating 41 shown in FIG. 4 for use in forming the row/column electrodes x, y and traces 22, is advantageous in this respect because it has a much lower sheet resistance (and thus more conductivity) than typical conventional ITO traces/electrodes.

Figure 4A:
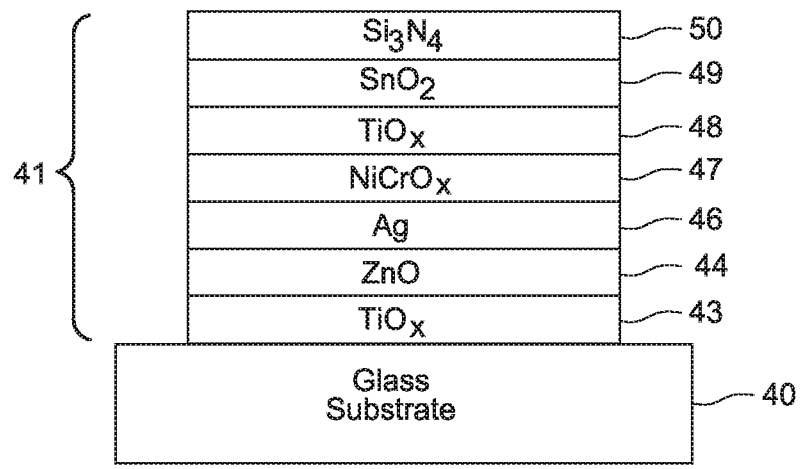
FIGS. 4(a)-4(c) are cross-sectional views of various silver-inclusive transparent conductive coatings for use in a touch panel of FIGS. 2, 3, 8, 9 and/or 10 according to exemplary embodiments.
Figure 4B:
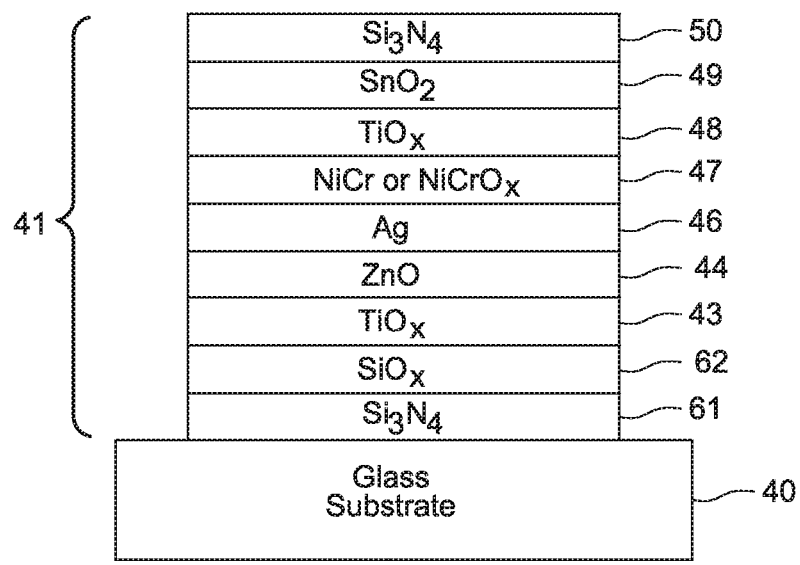
Figure 4C:
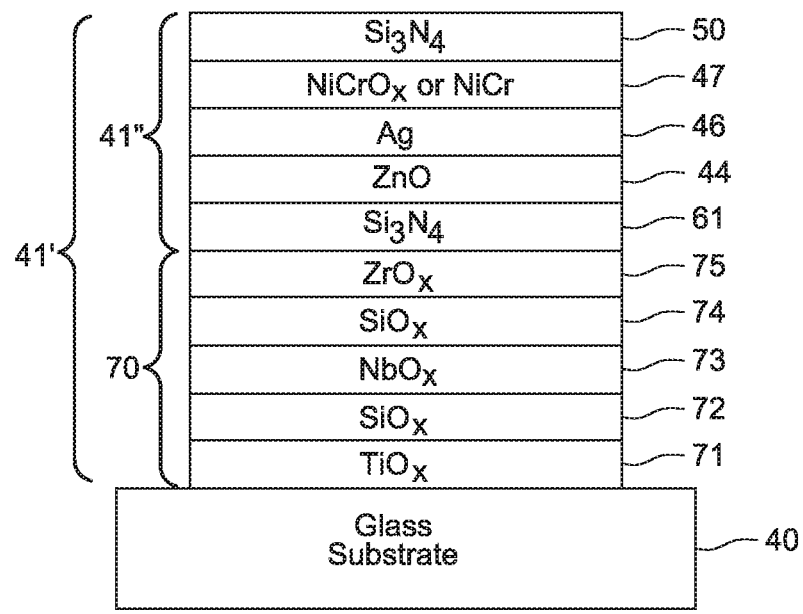

An example of a multilayer silver-inclusive transparent conductive coating (TCC) 41 with low sheet resistance, for forming row electrodes, column electrodes, and traces 22, is illustrated in FIG. 4 (FIGS. 4(a), 4(b) and 4(c)) according to exemplary embodiments of this invention. The low sheet resistance and high transparency of the TCC 41 allow the TCC to form the long narrow traces 22 as well as the row and column electrodes x, y.

Referring to FIG. 4(a), multilayer transparent conductive coating 41 in an example embodiment is provided, either directly or indirectly, on substrate 40. Substrate 40 may be, for example, glass. In alternative embodiments discussed below, an anti-reflective (AR) coating may be provided between the substrate 40 and the coating 41. Coating 41 may include, for example, a dielectric high index layer 43 of or including a material such as titanium oxide or niobium oxide, which may include titanium oxide (e.g., $TiO_2$ or other suitable stoichiometry); a dielectric layer of or including zinc oxide 44, optionally doped with aluminum, to be in contact with the silver-based layer; a silver-based conductive layer 46 on and directly contacting the zinc oxide based layer 44; an upper contact layer 47 including nickel and/or chromium which may be oxided and/or nitrided, that is over and contacting the silver-based conductive layer 46; a dielectric high index layer 48 of or including a material such as titanium oxide or niobium oxide, which may include titanium oxide (e.g., $TiO_2$ or other suitable stoichiometry); a dielectric layer 49 of or including tin oxide (e.g., $SnO_2$); and an outer-most protective dielectric layer 50 of or including silicon nitride and/or silicon oxynitride. Each of the layers in the coating 41 is designed to be substantially transparent (e.g., at least 70% or at least 80% transparent) to visible light. The dielectric high index layer 43 may be fully oxidized or sub-stoichiometric in different example embodiments. The silver layer 46 may or may not be doped with other materials (e.g., Pd) in certain example embodiments.

The coating 41 is designed to achieve good conductivity while at the same time to reduce visibility by more closely matching is visible reflectance (glass side and/or film side visible reflectance) to the visible reflectance of the supporting substrate 40. Note that the glass side visible reflectance is measured from the side of the coated glass substrate opposite the coating, whereas the film side visible reflectance is measured from the side of the coated glass substrate having the coating. Substantial matching of the visible reflectance of the coating 41 and the visible reflectance of the supporting glass substrate 40 reduces visibility of the electrodes and traces formed of the coating material 41. Surprisingly and unexpectedly, it has been found that adjusting certain dielectric thicknesses of the FIG. 4(a) coating can surprising improve (reduce) the visibility of the coating 41 and thus make the patterned electrodes and traces of the touch panel less visible to users and therefore more aesthetically pleasing. The coating 41 herein has a significantly less visibility on a glass substrate than those of US 2014/0145999 for example.

While various thicknesses and materials may be used in layers in different embodiments of this invention, example thicknesses and materials for the respective sputter-deposited layers of coating 41 on the glass substrate 40 in the FIG. 4(a) embodiment are as follows, from the glass substrate outwardly:

TABLE 1

| | FIG. 4(a) Transparent Conductive Coating | | | |
|---|---|---|---|---|
| Ref | Material | Preferred Thickness (Å) | More Preferred Thickness (Å) | Example Thickness (Å) |
| 43 | $TiO_x$ | 130-185 | 150-185 | 177 |
| 44 | ZnO | 50-140 | 60-100 | 83 |
| 46 | Ag | 90-160 | 115-140 | 124 |
| 47 | $NiCrO_x$ | 15-50 | 15-30 | 20 |
| 48 | $TiO_x$ | 10-60 | 15-35 | 23 |
| 49 | $SnO_2$ | 80-220 | 110-150 | 130 |
| 50 | $Si_xN_y$ | 300-400 | 300-320 | 305 |

It is noted that the above materials for coating 41 are exemplary, so that other material(s) may instead be used and certain layers may be omitted in certain example embodiments. A key feature to maintain is to provide for a coating that has both low sheet resistance, and has layers designed to reduce visibility of the coating 41 on the supporting glass substrate 40. In certain exemplary embodiments, glass substrate 40 with coating 41 thereon may be heat treated (e.g., thermally tempered), e.g., after coating, or chemically strengthened before coating.

Silver-inclusive coating 41 is inexpensive, has a low sheet resistance (preferably less than 15 ohms/square, more preferably less than about 10 or 5 ohms/square, with an example being approximately 4 ohms per square) and maintains high visible transmittance (preferably at least 60%, more preferably at least 70%, more preferably at least 80%, and most preferably at least 84%). The coating 41 preferably has a sheet resistance ($R_s$) of no greater than 8 ohms/square, more preferably no greater than 6 ohms/square, and most preferably no greater than about 4 ohms/square. The coating 41 is preferably deposited on substantially the entirety of the major surface of the glass substrate 40 away from the user (and then patterned to form the electrodes and traces) so as to reduce corrosive exposure to the atmosphere or contact with a finger or stylus. For example, the example display assembly shown in FIG. 7 includes a touch panel (20 or 30) mounted on a liquid crystal display panel (100-300). The row electrodes, column electrodes, and traces are formed from coating 41 on the surface of the glass substrate 40 opposite the finger, and the touch panel (20, 30) may be adhered to the LCD panel via an index-matching adhesive layer 85. The LCD panel includes first and second substrates (e.g., glass substrates) 100, 200 with a liquid crystal layer 300 provided therebetween. In order to form a touchscreen, the touch panel 20, 30 may optionally be mounted on the LCD panel with a small air gap or bonded to the display with an index-matching adhesive 85. Thus, reference numeral 85 in FIG. 7 represents either an air gap or an index matching adhesive between the display and the touch panel. It is noted that for the measurements taken for FIGS. 5-6 and 8(a)-(b), an air gap 85 was assumed so that the coating 41 was adjacent an air gap 85. In air gap embodiments, the periphery of the substrate 40 supporting the coating 41 may be bonded to the liquid crystal panel via adhesive or any other suitable type of edge seal material.

The pixel pitch for projected capacitive touch panels may, for example, be in the range of from about 6 to 7 mm. Touch location can be determined more accurately for example, to about 1 mm, by signal processing and interpolation. If the line width/spacing for the traces 22 is approximately 10 μm to 20 μm, it can be calculated that a projected capacitive touch panel of at least 20 inches (measured diagonally) is possible for a TCC sheet resistance of about 4 ohms/square. Further optimization of the routing, signal processing and/or noise suppression allows for production of even larger touch panels (for example, up to 40 or 50 inches diagonally). This invention is also applicable to smaller touch panels in certain example embodiments.

Example 1 Vs. Comparative Example (CE)

Surprisingly and unexpectedly, it has been found that adjusting certain dielectric thicknesses of the FIG. 4(a) coating can surprisingly reduce the visibility of the coating 41 on the supporting substrate 40, and thus make the electrodes and traces of the touch panel less visible to users and therefore the overall panel more aesthetically pleasing. This is evidenced, for example, by the comparison below between a Comparative Example (CE) and Example 1 of this invention, where the coatings include from the glass substrate outwardly:

TABLE 2

Comparative Example (CE) vs. Example 1

| Ref | Material | Comparative Example (CE) Thickness (Å) | Example 1 Thickness (Å) |
|---|---|---|---|
| 43 | $TiO_x$ | 194 | 177 |
| 44 | ZnO | 83 | 83 |
| 46 | Ag | 124 | 124 |
| 47 | NiCrOx | 20 | 20 |
| 48 | $TiO_x$ | 23 | 23 |
| 49 | $SnO_2$ | 30 | 130 |
| 50 | $Si_xN_y$ | 295 | 305 |

It can be seen from Table 2 above that the only difference between Example 1 according to this invention and the Comparative Example (CE) are the thicknesses of the dielectric layers 43 and 50. Surprisingly and unexpectedly, it has been found that adjusting the thicknesses of layers 43 and 50 the coating can surprising reduce the visibility of the coating 41 areas on the supporting glass substrate 40 by more closely matching the visible reflectance (e.g., glass side visible reflectance) of the coating 41 on the glass substrate to the visible reflection of the glass substrate 40 alone, and thus make the electrodes and traces of the touch panel less visible to users and therefore more aesthetically pleasing. This is shown in FIGS. 5-6 and also in the tables below.

FIG. 5 is a percent transmission/reflectance vs. wavelength (nm) graph illustrating the visible transmission (TR) percentage and glass side visible reflection (BRA) percentage of the Comparative Example (CE) coating on a glass substrate, compared to those values for the glass substrate alone (Glass-TR, Glass-BRA). Note that FIG. 5 includes the visible spectrum, as well as some wavelength outside the visible spectrum. The line plot with the "x" through it in FIG. 5 is the glass side visible reflection of the CE coating on the glass substrate 40 (i.e., reflection taken from the side of the finger in FIG. 7), and the line plot in FIG. 5 with the triangle marking through it is the visible reflection of the glass substrate 40 alone in areas where the coating 41 is not present. The difference between these two lines is important, because it shows the difference in glass side visible reflection between: (a) areas of the glass substrate 40 where the CE coating is not present (i.e., in non-electrode and non-trace areas), and (b) areas of the glass substrate 40 where the CE coating is present (i.e., in electrode and trace areas). Thus, the larger the difference between these two lines (the bottom two lines in the FIG. 5 graph), the more visible the electrodes and traces are to a viewer from the point of view on the finger side in FIG. 7. It can be seen in FIG. 5 that there is a significant gap (more than 2.0 difference in reflectance percentage) between these two lines around the visible wavelength 600 nm (including on both sides thereof), meaning that the electrodes and traces on a touch panel made of the CE material will be very visible which can render a touch panel or the like aesthetically non-pleasing.

In contrast, FIG. 6 is a percent visible transmission/reflectance vs. wavelength (nm) graph illustrating the visible transmission (CGN-TR or TR) and glass side visible reflection (CGN-BRA or BRA) of the Example 1 coating of FIG. 4(a) according to an example embodiment of this invention on a glass substrate, demonstrating that it is transparent to visible light and has glass side visible reflectance more closely matched to that of the glass substrate compared to the CE in FIG. 5. FIG. 6, like FIG. 5, also illustrates the visible transmission (Glass-TR) and visible reflectance (Glass-BRA) for the glass substrate alone in areas without the coating on it. The line plot with the "x" through it in FIG. 6 is the glass side visible reflection of the Example 1 coating 41 on the glass substrate 40, and the line plot in FIG. 6 with the triangular marking through it is the visible reflection of the glass substrate 40 alone without the coating 41 on it. The difference between these two lines is important, because it shows the difference in visible reflection (from the point of view of the finger in FIG. 7) between (a) areas of the glass substrate and touch panel where coating 41 is not present (i.e., in non-electrode and non-trace areas), and (b) areas of the glass substrate and touch panel where the coating 41 is present (i.e., in electrode and trace areas). Thus, the larger the difference between these two lines (the bottom two lines in the FIG. 6 graph), the more visible the electrodes and traces are to a viewer. And the smaller the difference between these two lines (the bottom two lines in the FIG. 6 graph), the less visible the electrodes and traces are to a viewer. Comparing FIGS. 5 and 6 to each other, it can be seen that in FIG. 6 that there is a much smaller gap (if any) between these two lines for the visible wavelengths from about 550 nm to about 650 nm compared to the larger gap for the CE in FIG. 5, meaning that the electrodes and traces on a touch panel made of the Example 1 material (FIG. 6) will be much less visible (compared to the CE material of FIG. 5) which renders the touch panel more aesthetically pleasing. In other words, compared to the CE, Example 1 more closely matches the glass side visible reflectance of the coating 41 on the glass substrate 40 to the visible reflection of the glass substrate 40 in areas where the coating is not present, and thus make the electrodes and traces of the touch panel less visible to users and therefore more aesthetically pleasing.

The table below shows optical differences between the Comparative Example (CE) and Example 1, where at 550 nm TR is visible transmission, RA is film side visible reflectance which is measured viewing the glass/coating combination from the coating side, and BRA is glass side visible reflectance which is measured viewing the glass/coating combination from the glass side. As will be recognized by one skilled in the art, a* and b* are color values measured with respect to transmissive color [a*(TR) and b*(TR)], and glass side reflective color [a*(BRA and b*(BRA)].

TABLE 3

Comparative Example (CE) vs. Example 1 (Optical Parameters) [Ill. C 2 deg.]

| Parameter | Comparative Example (CE) on glass substrate | Example 1 on glass substrate (FIG. 4a embodiment) | Glass substrate alone |
|---|---|---|---|
| TR (%) | 88% | 85.47% | 91.7% |
| a* (TR) | −1 | −0.60 | −0.35 |
| b* (TR) | 1.5 | 1.05 | 0.18 |
| BRA (%) | 5.8% | 8.20% | 8.11% |
| a* (BRA) | −2.2 | −2.37 | −0.17 |
| b* (BRA) | −6 | −6.43 | −0.74 |

It is important here that the glass side visible reflection (BRA) of the coating 41 on the glass substrate 40 for Example 1 more closely matches the visible reflection of the glass substrate 40 alone (8.20% vs. 8.11%), compared to the CE (5.8% vs. 8.11%). Thus, the patterned coating 41 on the glass substrate 40 is much less visible for Example 1 compared to the CE.

In certain example embodiments of this invention (e.g., FIGS. 2-7), the coating 41 (unlike the CE) on a glass substrate 40 has a film side visible reflectance (RA) from 550-600 nm of from 7-10%, more preferably from 7.5 to 8.5%. And in certain example embodiments of this invention, the coating 41 (unlike the CE) on a glass substrate 40 has a glass side visible reflectance (BRA) from 550-600 nm of from 7-13%, more preferably from 7-9%, and still more preferably from 7.25 to 8.75% (the BRA for the CE was only 5.8% as seen above). In certain example embodiments of this invention, unlike the CE, there is no more than a 2.0 difference (more preferably no more than a 1.5 or 1.0 difference) at 550 nm and/or 600 nm, or in the range from 550-600 nm, between: (a) the film side and/or glass side visible reflectance percentage of a coated article including the coating 41 on a glass substrate 40 (in the area where the coating 41 is present), and (b) the visible reflectance percentage of the glass substrate alone in areas where coating 41 is not present. This can be seen in FIG. 6 for example (see also FIGS. 8(a)-(b)). In contrast, for example, for the CE it can be seen from the above that there is a 2.31 difference (8.11%−5.8%=2.31) between (a) the glass side visible reflectance percentage of a coated article including the CE coating on a glass substrate 40 in the area where the coating 41 is present, and (b) the visible reflectance percentage of the glass substrate alone, which is too much of a difference and renders the electrodes and traces easily visible to viewers viewing the device from the side of the finger shown in FIG. 7. Example embodiments of this invention have reduced this difference to no more than 2.0, more preferably no more than 1.5, and most preferably no more than 1.0.

In certain example embodiments, an antireflective (AR) coating may be provided between the glass substrate 40 and the coating 41 of any of FIGS. 4(a)-(c) to still more closely match the visible reflectance (glass side and/or film side) of the coating to that of the supporting substrate (glass plus AR coating). The AR coating may be applied across the entire or substantially the entire major surface of the glass substrate 40, and unlike the transparent conductive coating 41, the AR coating need not be patterned in certain example embodiments. As another optional, an AR coating may in effect be provided as a bottom portion of the coating 41 in order to add AR effect to the coating 41.

FIG. 4(b) illustrates a multilayer transparent conductive coating 41 according to another example embodiment which may be provided, either directly or indirectly, substrate 40 in any of the devices or products discussed herein (e.g., see FIGS. 2-3, 7 and 9-14). Substrate 40 may be, for example, glass or glass coated with an AR coating. Coating 41 of the FIG. 4(b) embodiment may include, for example, base dielectric layer 61 or of including silicon nitride (e.g., $Si_3N_4$ or other suitable stoichiometry), which may or may not be doped with Al and/or oxygen; low index dielectric layer 62 of or including silicon oxide (e.g., $SiO_2$ or other suitable stoichiometry) which may or may not be doped with Al and/or nitrogen; a dielectric high index layer 43 of or including a material such as titanium oxide or niobium oxide, which may include titanium oxide (e.g., $TiO_2$ or other suitable stoichiometry); a dielectric layer of or including zinc oxide 44, optionally doped with aluminum, to be in contact with the silver-based layer; a silver-based conductive layer 46 on and directly contacting the zinc oxide based layer 44; an upper contact layer 47 including nickel and/or chromium which may be oxided and/or nitrided, that is over and contacting the silver-based conductive layer 46; a dielectric high index layer 48 of or including a material such as titanium oxide or niobium oxide, which may include titanium oxide (e.g., $TiO_2$ or other suitable stoichiometry); a dielectric layer 49 of or including tin oxide (e.g., $SnO_2$); and an outer-most protective dielectric layer 50 of or including silicon nitride and/or silicon oxynitride. Each of the layers in the coating 41 is designed to be substantially transparent (e.g., at least 70% or at least 80% transparent) to visible light. The silver layer 46 may or may not be doped with other materials (e.g., Pd) in certain example embodiments.

The coatings 41 of FIGS. 4(a)-(c) are designed to achieve good conductivity while at the same time to reduce visibility by more closely matching is visible reflectance (glass side and/or film side visible reflectance) to the visible reflectance of the supporting substrate 40. Substantial matching of the visible reflectance of the coating 41 and the visible reflectance of the supporting glass substrate 40 reduces visibility of the electrodes and traces formed of the coating material 41. While various thicknesses and materials may be used in layers in different embodiments of this invention, example thicknesses and materials for the respective sputter-deposited layers of coating 41 on the glass substrate 40 in the FIG. 4(b) embodiment are as follows, from the glass substrate outwardly:

TABLE 4

FIG. 4(b) Transparent Conductive Coating

| Ref | Material | Preferred Thickness (Å) | More Preferred Thickness (Å) | Example Thickness (Å) |
|---|---|---|---|---|
| 61 | $Si_xN_y$ | 200-500 | 250-400 | 318 |
| 62 | $SiO_x$ | 200-600 | 400-500 | 440 |
| 43 | $TiO_x$ | 130-185 | 150-185 | 354 |
| 44 | ZnO | 50-140 | 60-100 | 83 |
| 46 | Ag | 90-160 | 115-140 | 124 |
| 47 | NiCrOx | 15-50 | 15-30 | 20 |
| 48 | $TiO_x$ | 10-60 | 15-35 | 23 |
| 49 | $SnO_2$ | 80-220 | 110-150 | 130 |
| 50 | $Si_xN_y$ | 300-400 | 300-320 | 303 |

It is noted that the above materials for FIG. 4(b) coating 41 are exemplary, so that other material(s) may instead be used and certain layers may be omitted in certain example embodiments. A key feature to maintain is to provide for a coating that has both low sheet resistance, and has layers designed to reduce visibility of the coating 41 on the supporting glass substrate 40. In certain exemplary embodiments, glass substrate 40 with coating 41 thereon may be heat treated (e.g., thermally tempered), e.g., after coating, or chemically strengthened before coating. As with the FIG. 4(a) embodiment, the silver-based coating 41 of the FIG. 4(b) embodiment is inexpensive, has a low sheet resistance (preferably less than 15 ohms/square, more preferably less than about 10 or 5 ohms/square, with an example being approximately 4 ohms per square) and maintains high visible transmittance (preferably at least 60%, more preferably at least 70%, more preferably at least 80%, and most preferably at least 84%). The coating 41 is preferably deposited on substantially the entirety of the major surface of the glass substrate 40 away from the user (and then patterned to form the electrodes and traces discussed herein) so as to reduce corrosive exposure to the atmosphere or contact with a finger or stylus as discussed above.

Example 2 Vs. Comparative Example (CE)

Example 2 utilizes a coating according to the FIG. 4(b) embodiment. Surprisingly and unexpectedly, it has been found that the FIG. 4(b) coating can surprisingly reduce the visibility of the coating 41 on the supporting substrate 40, and thus make the electrodes and traces of the touch panel less visible to users and therefore the overall panel more aesthetically pleasing compared to the CE discussed above. This is evidenced, for example, by the comparison below between a Comparative Example (CE) and Example 2 of this invention, where the coatings include from the glass substrate outwardly:

TABLE 5

Comparative Example (CE) vs. Example 2

| Ref | Material | Example 2 Thickness (Å) |
|---|---|---|
| 61 | $Si_3N_4$ | 318 |
| 62 | $SiO_2$ | 440 |
| 43 | $TiO_2$ | 354 |
| 44 | ZnO | 83 |
| 46 | Ag | 124 |
| 47 | NiCrOx | 20 |
| 48 | $TiO_2$ | 23 |
| 49 | $SnO_2$ | 130 |
| 50 | $Si_3N_4$ | 303 |

FIG. 5 is discussed above, and illustrates properties of the CE.

In contrast, FIG. 8(a) is a percent visible transmission/reflectance vs. wavelength (nm) graph illustrating the visible transmission (CGN-TR or TR) and glass side visible reflection (CGN-BRA or BRA) of Example 2 of this invention, demonstrating that it is transparent to visible light and has a glass side visible reflectance more closely matched to the reflectance of the glass substrate alone compared to the CE of FIG. 5. FIG. 8(a) also illustrates the visible transmission (Glass-TR) and visible reflectance (Glass-BRA) for just the glass substrate absent the coating. The line plot with the "x" through it in FIG. 8(a) is the glass side visible reflection of the Example 2 coating 41 on the glass substrate 40, and the line plot in FIG. 8(a) with the triangular marking through it is the visible reflection of the glass substrate 40 alone without the coating 41 on it. The difference between these two lines is important, because it shows the difference in visible reflection (from the point of view of the finger in FIG. 7) between (a) areas of the glass substrate and touch panel where coating 41 is not present (i.e., in non-electrode and non-trace areas), and (b) areas of the glass substrate and touch panel where the coating 41 is present (i.e., in electrode and trace areas). Thus, the larger the difference between these two lines (the bottom two lines in the FIG. 8(a) graph), the more visible the electrodes and traces are to a viewer. And the smaller the difference between these two lines (the bottom two lines in the FIG. 8(a) graph), the less visible the electrodes and traces are to a viewer. Comparing FIGS. 5 and 8(a) to each other, it can be seen that in FIG. 8(a) that there is a much smaller gap (if any) between these two lines for the visible wavelengths from about 550 nm to about 650 nm compared to the larger gap for the CE in FIG. 5, meaning that the electrodes and traces on a touch panel made of the Example 2 material will be much less visible (compared to the CE material of FIG. 5) which renders the touch panel more aesthetically pleasing. In other words, compared to the CE, Example 2 more closely matches the glass side visible reflectance of the coating 41 on the glass substrate 40 to the visible reflection of the glass substrate 40 in areas where the coating is not present, and thus make the electrodes and traces of the touch panel less visible to users and therefore more aesthetically pleasing.

The table below shows optical differences between the Comparative Example (CE) and Example 2, where at 550 nm TR is visible transmission, RA is film side visible reflectance which is measured viewing the glass/coating combination from the coating side, and BRA is glass side visible reflectance which is measured viewing the glass/coating combination from the glass side. As will be recognized by one skilled in the art, a* and b* are color values measured with respect to transmissive color [a*(TR) and b*(TR)], and glass side reflective color [a*(BRA and b*(BRA)].

TABLE 6

Comparative Example (CE) vs. Example 2 (Optical Parameters) [Ill. C 2 deg.]

| Parameter | Comparative Example (CE) on glass substrate | Example 2 on glass substrate (FIG. 4b embodiment) | Glass substrate alone |
|---|---|---|---|
| TR (%) | 88% | 85.75% | 91.7% |
| a* (TR) | −1 | −1.05 | −0.35 |
| b* (TR) | 1.5 | −0.31 | 0.18 |
| BRA (%) | 5.8% | 7.86% | 8.11% |
| a* (BRA) | −2.2 | 0.02 | −0.17 |
| b* (BRA) | −6 | −0.33 | −0.74 |

It is important here that the glass side visible reflection (BRA) of the coating 41 on the glass substrate 40 for Example 2 more closely matches the visible reflection of the glass substrate 40 alone (7.86% vs. 8.11%), compared to the CE (5.8% vs. 8.11%). Thus, the patterned coating 41 on the glass substrate 40 is much less visible for Example 2 compared to the CE. As discussed above, in certain example embodiments of this invention (e.g., FIGS. 2-7), the coating 41 (unlike the CE) on a glass substrate 40 has a film side visible reflectance (RA) from 550-600 nm of from 7-10%, more preferably from 7.5 to 8.5%. And in certain example embodiments of this invention, the coating 41 (unlike the CE) on a glass substrate 40 has a glass side visible reflectance (BRA) from 550-600 nm of from 7-13%, more preferably from 7-9%, and still more preferably from 7.25 to 8.75% (the BRA for the CE was only 5.8% as seen above). As also mentioned above, in certain example embodiments of this invention (FIGS. 2-14), unlike the CE, there is no more than a 2.0 difference (more preferably no more than a 1.5 or 1.0 difference) at 550 nm and/or 600 nm, or in the range from 550-600 nm, between: (a) the film side and/or glass side visible reflectance percentage of a coated article including the coating 41 on a glass substrate 40 (in the area where the coating 41 is present), and (b) the visible reflectance percentage of the glass substrate alone in areas where coating 41 is not present. This can be seen in FIG. 8(a) for example (see also FIGS. 6 and 8(b)). In contrast, for example, for the CE it can be seen from the above that there is a 2.31 difference (8.11%–5.8%=2.31) between (a) the glass side visible reflectance percentage of a coated article including the CE coating on a glass substrate 40 in the area where the coating 41 is present, and (b) the visible reflectance percentage of the glass substrate alone, which is too much of a difference and renders the electrodes and traces easily visible to viewers viewing the device from the side of the finger shown in FIG. 7. Example embodiments of this invention have reduced this difference to no more than 2.0, more preferably no more than 1.5, and most preferably no more than 1.0.

FIG. 4(c) illustrates a multilayer transparent conductive coating (41' or 41") according to another example embodiment which may be provided, either directly or indirectly, substrate 40 in any of the devices or products discussed herein (e.g., see FIGS. 2-3, 7 and 9-14). Substrate 40 may be, for example, glass. Coating 41' of the FIG. 4(c) embodiment may include, for example, an antireflective (AR) section 70 including a dielectric high index layer 71 of or including a material such as titanium oxide or niobium oxide, which may include titanium oxide (e.g., $TiO_2$ or other suitable stoichiometry); low index dielectric layer 72 of or including silicon oxide (e.g., $SiO_2$ or other suitable stoichiometry) which may or may not be doped with Al and/or nitrogen; a dielectric high index layer 73 of or including a material such as titanium oxide or niobium oxide; another low index dielectric layer 74 of or including silicon oxide (e.g., $SiO_2$ or other suitable stoichiometry) which may or may not be doped with Al and/or nitrogen, and a dielectric layer 75 of or including zirconium oxide (e.g., $ZrO_2$ or other suitable stoichiometry). The "substrate" in the FIG. 4(c) embodiment may be considered the glass 40 plus the AR section 70 of the coating, as the AR section 70 of the coating 41' need not be patterned along with the rest of the coating 41', and in such a case the transparent conductive coating of the FIG. 4(c) embodiment may be considered to be made up of just the layers 61, 44, 46, 47 and 50. In other words, in the FIG. 4(c) embodiment, the multi-layer transparent conductive coating may be considered as 41" which is made up of layers 61, 44, 46, 47 and 50, and the "substrate" may be considered to be the combination of the glass 40 and the AR coating 70.

The coating 41 of the FIG. 4(c) embodiment may further include, as section 41", dielectric layer 61 or of including silicon nitride (e.g., $Si_3N_4$ or other suitable stoichiometry), which may or may not be doped with Al and/or oxygen; a dielectric layer of or including zinc oxide 44, optionally doped with aluminum, to be in contact with the silver-based layer; a silver-based conductive layer 46 on and directly contacting the zinc oxide based layer 44; an upper contact layer 47 including nickel and/or chromium which may be oxided and/or nitrided, that is over and contacting the silver-based conductive layer 46; optionally a dielectric high index layer 48 of or including a material such as titanium oxide or niobium oxide, which may include titanium oxide (e.g., $TiO_2$ or other suitable stoichiometry); and an outermost protective dielectric layer 50 of or including silicon nitride and/or silicon oxynitride. Each of the layers in the coating 41 of the FIG. 4(a)-(c) embodiments is designed to be substantially transparent (e.g., at least 70% or at least 80% transparent) to visible light.

The coating 41 of FIG. 4(c) is designed to achieve good conductivity while at the same time to reduce visibility by more closely matching is visible reflectance (glass side and/or film side visible reflectance) to the visible reflectance of the supporting substrate. Substantial matching of the visible reflectance of the coating 41 and the visible reflectance of the supporting substrate reduces visibility of the electrodes and traces formed of the coating material 41. While various thicknesses and materials may be used in layers in different embodiments of this invention, example thicknesses and materials for the respective sputter-deposited layers of coating 41 on the glass 40 in the FIG. 4(c) embodiment are as follows, from the glass outwardly:

TABLE 7

FIG. 4(c) Coating

| Ref | Material | Preferred Thickness (Å) | More Preferred Thickness (Å) | Example Thickness (Å) |
| --- | --- | --- | --- | --- |
| 71 | $TiO_x$ | 40-350 | 50-250 | 100 |
| 72 | $SiO_x$ | 200-600 | 300-450 | 373 |
| 73 | $NbO_x$ | 200-2000 | 500-1500 | 1112 |
| 74 | $SiO_x$ | 200-1200 | 500-950 | 744 |
| 75 | $ZrO_x$ | 30-120 | 30-80 | 50 |
| 61 | $Si_xN_y$ | 150-500 | 200-400 | 271 |
| 44 | ZnO | 50-140 | 60-100 | 83 |
| 46 | Ag | 90-160 | 115-150 | 131 |
| 47 | NiCrOx | 15-50 | 15-30 | 20 |
| 50 | $Si_xN_y$ | 300-450 | 300-350 | 339 |

It is noted that the above materials for FIG. 4(c) coating 41 are exemplary, so that other material(s) may instead be used and certain layers may be omitted in certain example embodiments. A key feature to maintain is to provide for a coating that has both low sheet resistance, and has layers designed to reduce visibility of the coating 41 on the supporting substrate. In certain exemplary embodiments, glass substrate 40 with coating 41 thereon may be heat treated (e.g., thermally tempered), e.g., after coating, or chemically strengthened before coating. As with the FIG. 4(a)-(b) embodiments, the silver-based coating 41 of the FIG. 4(c) embodiment is inexpensive, has a low sheet resistance (preferably less than 15 ohms/square, more preferably less than about 10 or 5 ohms/square, with an example being approximately 4 ohms per square) and maintains high visible transmittance (preferably at least 60%, more preferably at least 70%, more preferably at least 80%, and most preferably at least 84%). The coating 41 is preferably deposited on substantially the entirety of the major surface of the glass substrate 40 away from the user (and then patterned to form the electrodes and traces discussed herein) so as to reduce corrosive exposure to the atmosphere or contact with a finger or stylus as discussed above.

Example 3 Vs. Comparative Example (CE)

Example 3 utilizes a coating according to the FIG. 4(c) embodiment. Surprisingly and unexpectedly, it has been found that the FIG. 4(c) coating can surprisingly reduce the visibility of the coating 41 on the supporting substrate, and thus make the electrodes and traces of the touch panel less visible to users and therefore the overall panel more aesthetically pleasing compared to the CE discussed above. This is evidenced, for example, by the comparison below between a Comparative Example (CE) and Example 3 of this invention, where the coatings include from the glass outwardly:

TABLE 8

Comparative Example (CE) vs. Example 3

| Ref | Material | Example 3 Thickness (Å) |
|---|---|---|
| 71 | TiO$_2$ | 100 |
| 72 | SiO$_2$ | 373 |
| 73 | NbO$_x$ | 1112 |
| 74 | SiO$_2$ | 744 |
| 75 | ZrO$_2$ | 50 |
| 61 | Si$_3$N$_4$ | 271 |
| 44 | ZnO | 83 |
| 46 | Ag | 131 |
| 47 | NiCrO$x$ | 20 |
| 50 | Si$_3$N$_4$ | 339 |

FIG. 5 is discussed above, and illustrates properties of the CE.

In contrast, FIG. 8(b) is a percent visible transmission/reflectance vs. wavelength (nm) graph illustrating the visible transmission (CGN-TR or TR) and glass side visible reflection (CGN-BRA or BRA) of Example 3 according to another example embodiment of this invention, demonstrating that it is transparent to visible light and has a glass side visible reflectance more closely matched to the reflectance of the substrate compared to the CE. FIG. 8(b) also illustrates the visible transmission (Glass-TR) and visible reflectance (Glass-BRA) for just the glass substrate and AR section 71-75 absent the other layers (61, 44, 46, 47 and 50) of the coating. The line plot with the "x" through it in FIG. 8(b) is the glass side visible reflection of the Example 3 coating 41 on the glass substrate 40, and the line plot in FIG. 8(b) with the triangular marking through it is the visible reflection of the glass substrate 40 with only the AR section 70-75 thereon. The difference between these two lines is important, because it shows the difference in visible reflection (from the point of view of the finger in FIG. 7) between (a) areas of the glass substrate and touch panel where just the AR section of the coating is present (i.e., in non-electrode and non-trace areas), and (b) areas of the glass substrate and touch panel where the entire coating 41 is present (i.e., in electrode and trace areas). Thus, the larger the difference between these two lines (the bottom two lines in the FIG. 8(b) graph), the more visible the electrodes and traces are to a viewer. And the smaller the difference between these two lines (the bottom two lines in the FIG. 8(b) graph), the less visible the electrodes and traces are to a viewer. Comparing FIGS. 5 and 8(b) to each other, it can be seen that in FIG. 8(b) that there is a much smaller gap (if any) between these two lines for the visible wavelengths from about 550 nm to about 650 nm compared to the larger gap for the CE in FIG. 5, meaning that the electrodes and traces on a touch panel made of the Example 3 material will be much less visible (compared to the CE material of FIG. 5) which renders the touch panel more aesthetically pleasing. In other words, compared to the CE, Example 3 more closely matches the glass side visible reflectance of the coating 41 on the glass substrate 40 to the visible reflection of the supporting substrate (glass plus AR layers), and thus make the electrodes and traces of the touch panel less visible to users and therefore more aesthetically pleasing.

The table below shows optical characteristics of Example 3, where at 550 nm TR is visible transmission, RA is film side visible reflectance which is measured viewing the glass/coating combination from the coating side, and BRA is glass side visible reflectance which is measured viewing the glass/coating combination from the glass side. As will be recognized by one skilled in the art, a* and b* are color values measured with respect to transmissive color [a*(TR) and b*(TR)], and glass side reflective color [a*(BRA and b*(BRA)]. In the table below for Example 3, the glass substrate parameters are for the glass substrate with only AR layers 71-75 thereon across the entire substrate 40, and the Example 3 parameters are for the entire coating 41 on the glass substrate 40 (i.e., the AR layers 71-75 may be provided across substantially the entire substrate whereas the layers 61, 44, 46, 47 and 50 may be patterned to form the electrodes and traces).

TABLE 9

Example 3 (Optical Parameters) [Ill. C 2 deg.]

| Parameter | Example 3 on glass substrate (FIG. 4c embodiment) | Glass substrate with only AR layers 71-75 thereon |
|---|---|---|
| TR (%) | 85.61% | 94.80% |
| a* (TR) | −0.78 | −0.30 |
| b* (TR) | −0.94 | 0.35 |
| BRA (%) | 4.99% | 4.51% |
| a* (BRA) | −0.15 | −0.44 |
| b* (BRA) | −1.38 | −2.34 |

It is important here that the glass side visible reflection (BRA) of the entire coating 41 on the glass substrate 40 for Example 3 closely matches the visible reflection of the glass substrate 40 with only the AR layers 71-75 thereon (4.99% vs. 4.51%). Thus, the patterned coating portion (61, 44, 46, 47 and 50) on the substrate is much less visible for Example 3 compared to the CE. In certain example embodiments of this invention, the coating 41 (unlike the CE) of this embodiment on a glass substrate 40 has a glass side visible reflectance (BRA) from 550-600 nm of from 4-13%, more preferably from 4.5-9%, and still more preferably from 4.5 to 8.75%. As also mentioned above, in certain example embodiments of this invention (FIGS. 2-14), unlike the CE, there is no more than a 2.0 difference (more preferably no more than a 1.5 or 1.0 difference) at 550 nm and/or 600 nm, or in the range from 550-600 nm, between: (a) the film side and/or glass side visible reflectance percentage of a coated article including the entire coating 41 on a glass substrate 40 (in the area where the coating 41 is entirely present), and (b) the visible reflectance percentage of the glass substrate areas where only the glass 40 and AR layers 71-75 are present. This can be seen in FIG. 8(b) for example. In contrast, for example, for the CE it can be seen from the above that there is a 2.31 difference (8.11%−5.8%=2.31) between (a) the glass side visible reflectance percentage of a coated article including the CE coating on a glass substrate 40 in the area where the coating 41 is present, and (b) the visible reflectance percentage of the glass substrate alone, which is too much of a difference and renders the electrodes and traces easily visible to viewers viewing the device from the side of the finger shown in FIG. 7. Example embodiments of this invention have reduced this difference to no more than 2.0, more preferably no more than 1.5, and most preferably no more than 1.0.

Figure 9:
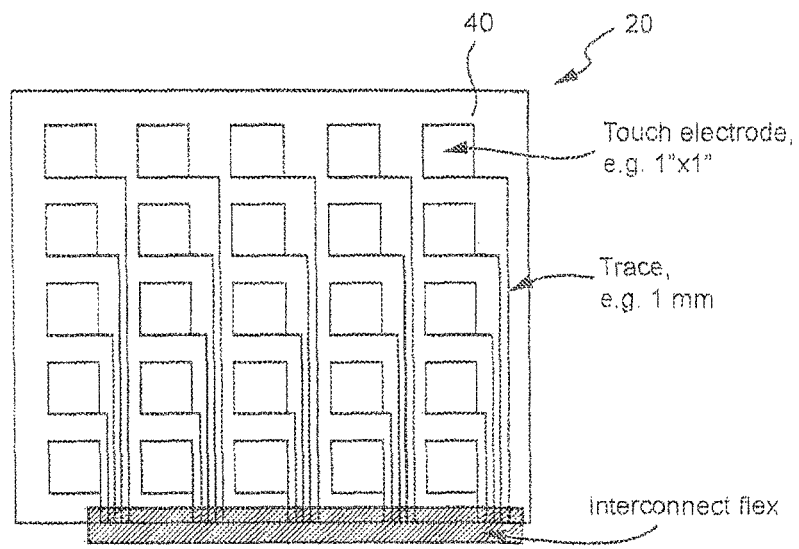
FIG. 9 illustrates a top or bottom plan layout of a low resolution capacitive touch panel according to another example embodiment, that may contain the coating(s) of FIGS. 4, 6, 7, 8 as conductive electrode(s) and/or conductive trace(s).

The patterned low sheet resistance coatings 41 herein (e.g., any of the FIG. 2-8 embodiments) may also be used in low resolution touch panel applications (e.g., see FIG. 9).

Examples are interactive storefronts, preferably standalone, but possibly also in combination with a projected image on the glass assembly or with direct view displays. Low resolution touch panels on glass allow the user to select information or otherwise interact with the glass surface while simultaneously viewing what's behind the glass. In a standalone configuration, the touch panel may be operated from both sides of the glass panel. Low resolution capacitive touch panels may be for example an array of 5×5 touch buttons, each about a square inch and separated by about half an inch, as shown in FIG. 9. The touch principle of operation may be self-capacitance which can detect gloved fingers as well as bare fingers. The interconnect flex circuit in FIG. 9 is connected to a touch controller and the function of each button can therefore be reconfigured in software or firmware. The lower resolution touch interface is easier to make than a multi-touch panel on top of a high resolution LCD, because the minimum feature size for the patterning coating 41 by laser, photolithography or other method can be much larger. For example, the minimum feature size for the traces could be about 1 mm, so that the requirements for pinholes, scratches and other defects in the glass and in the coating are greatly relaxed. In other words, it allows the use of standard soda lime glass 40 and coatings 41 produced in a horizontal architectural coater. For certain low resolution touch applications, there is no need for the advanced clean room facilities that typically are used to produce high resolution multi-touch panels for phones, tablets, laptops and larger size multi-touch panels. The wider traces (e.g ~1 mm) also reduce the resistance and signal delay from the touch electrodes.

Figure 10:
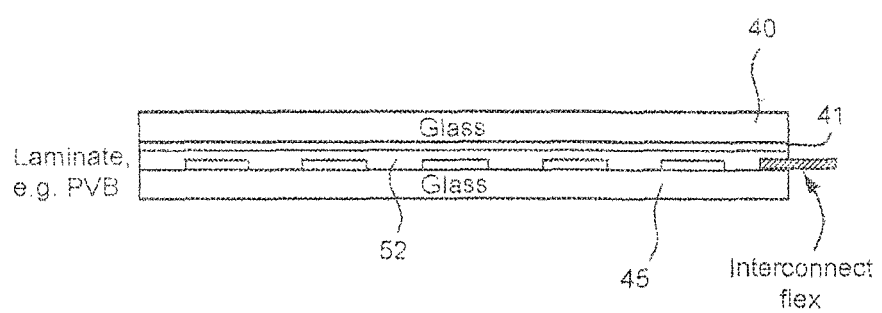
FIG. 10 is a cross sectional view of a low resolution capacitive touch panel according to another example embodiment where the substrate supporting the coating of this invention of FIG. 9 may be laminated to another substrate (e.g., glass) via a polymer inclusive interlayer such as PVB.
Figure 11:
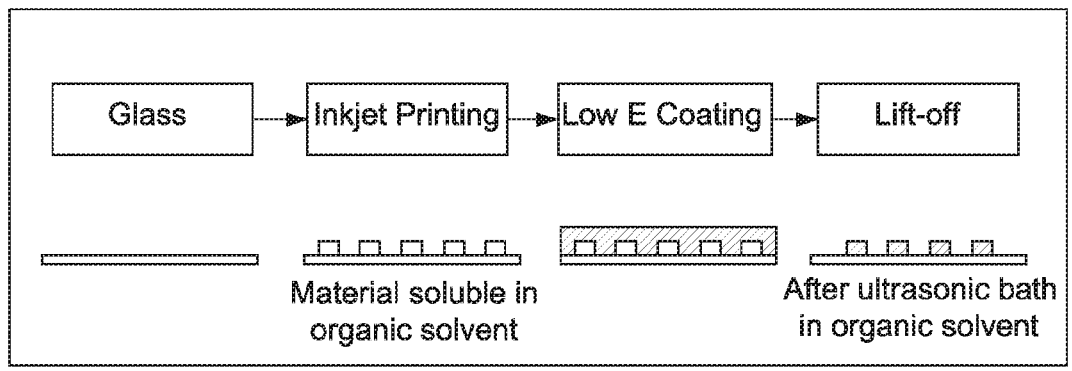
FIG. 11 is a flow chart of a process for making the transparent conductive coating pattern according to any of FIG. 2, 3, 4, 7, 8, 9, or 10 according to an example embodiment of this invention.
Figure 12:
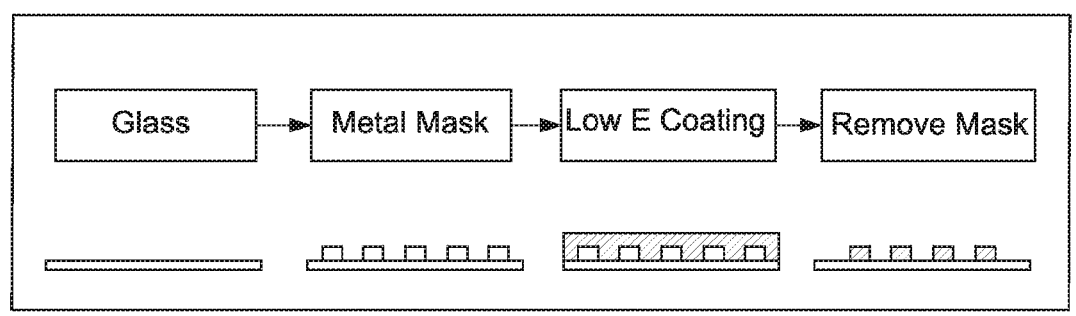
FIG. 12 is a flow chart of a process for making the transparent conductive coating pattern according to any of FIG. 2, 3, 4, 7, 8, 9, or 10 according to another example embodiment of this invention.
Figure 13:
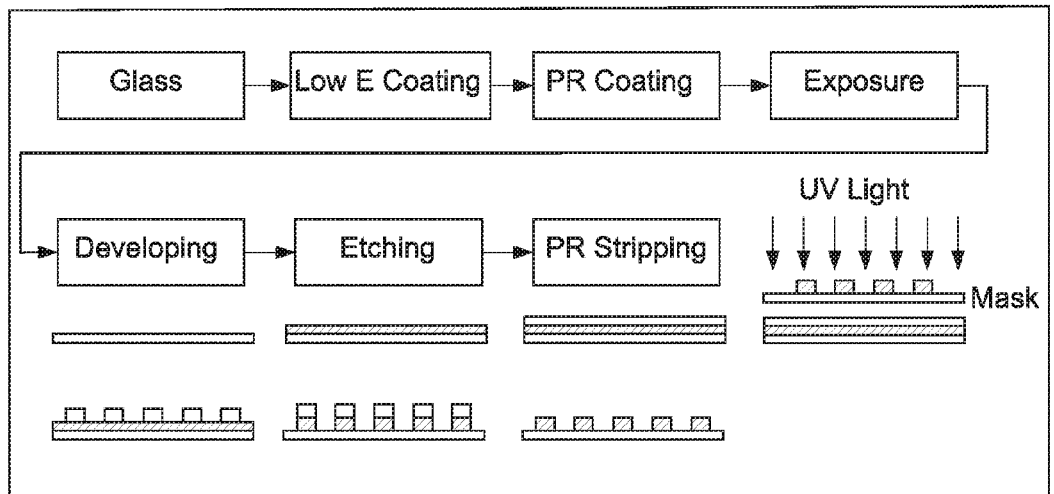
FIG. 13 is a flow chart of a process for making the transparent conductive coating pattern according to any of FIG. 2, 3, 4, 7, 8, 9, or 10 according to another example embodiment of this invention.
Figure 14:
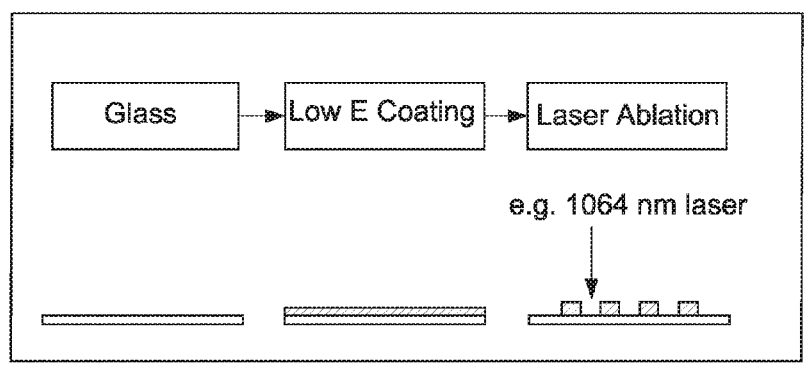
FIG. 14 is a flow chart of a process for making the transparent conductive coating pattern according to any of FIG. 2, 3, 4, 7, 8, 9, or 10 according to another example embodiment of this invention.

Referring to the laminated FIG. 10 embodiment (the coatings of any of FIGS. 2-8 may be used in the FIG. 10 embodiment), to further protect the patterned silver based coating 41 from corrosion in a standalone application, the touch panel substrate 40 (with or without an AR coating thereon between 40 and 41) is laminated to another glass substrate 45 with PVB or other polymer inclusive lamination material 52. The PVB 52 will encapsulate the patterned coating 41, so that corrosion is further inhibited.

It is noted that in various embodiments of this invention, electrode patterns other than a rectangular array of buttons can be envisioned including patterns allowing swiping, circular patterns for dials, and so forth. Potential applications include storefronts, commercial refrigerators, appliances, glass walls in office or other environments, transportation, dynamic glazing, vending machines, and so forth, where a see-through low resolution touch panel is beneficial as a user interface. A silver-based coating 41 has up to 10× lower sheet resistance than ITO at about 4× lower cost and will therefore be more cost-effective.

The sputter-deposited coating 41 discussed above in connection with FIGS. 2-10 may be formed and patterned in any of a variety of manners. For example, the sputter-deposited coating 41 may be formed by inkjet printing and lift-off (see FIG. 11), metal shadow mask patterning (see FIG. 12), photolithograph (see FIG. 13), or laser patterning (see FIG. 14).

In certain example embodiments of this invention, there is provided a capacitive touch panel, comprising: a substrate (glass, or combination of glass and an AR coating); a multi-layer transparent conductive coating supported by the substrate, wherein the multi-layer transparent conductive coating comprises at least one conductive layer comprising silver located between at least a first dielectric layer and a second dielectric layer, wherein the multi-layer transparent conductive coating, comprising at least the conductive layer comprising silver located between at least the first dielectric layer and the second dielectric, is patterned into a plurality of electrodes for the touch panel; a processor which measures capacitance between electrodes in detecting touch position on the touch panel, wherein the electrodes formed from the multi-layer transparent conductive coating are formed substantially in a common plane substantially parallel to the substrate, and wherein there is no more than a 2.0 (more preferably no more than 1.5, and most preferably no more than 1.0) difference at a visible wavelength 600 nm (or in the visible spectrum range from 550-600 nm) between (a) a glass side and/or film side visible reflectance percentage of the multi-layer transparent conductive coating on the substrate in areas where the coating is present, and (b) a visible reflectance percentage of the substrate in at least some areas where the multi-layer transparent conductive coating is not present.

In the capacitive touch panel of the immediately preceding paragraph, the substrate may be a glass substrate or a substrate made up of glass coated with an antireflective (AR) coating.

In the capacitive touch panel of any of the preceding two paragraphs, the first dielectric layer may comprises titanium oxide and/or the second dielectric layer may comprise tin oxide.

In the capacitive touch panel of any of the preceding three paragraphs, the multi-layer transparent conductive coating may comprise, moving away from the substrate: a first dielectric layer comprising titanium oxide; another dielectric layer comprising zinc oxide; a conductive layer comprising silver directly contacting the dielectric layer comprising zinc oxide; a contact layer over and contacting the conductive layer comprising silver; another dielectric layer comprising titanium oxide; another dielectric layer comprising tin oxide; and another dielectric layer comprising silicon nitride. Optionally, the contact layer may comprise an oxide of Ni and/or Cr. The first dielectric layer comprising titanium oxide may have a thickness of from about 130-185 angstroms (more preferably from about 150-185 angstroms), and/or the dielectric layer comprising silicon nitride may have a thickness of from about 300-400 angstroms (more preferably from about 300-320 angstroms).

In the capacitive touch panel of any of the preceding four paragraphs, the multi-layer transparent conductive coating may comprise, moving away from the substrate: a dielectric layer comprising silicon nitride; a dielectric layer comprising silicon oxide; a dielectric layer comprising titanium oxide; another dielectric layer comprising zinc oxide; a conductive layer comprising silver directly contacting the dielectric layer comprising zinc oxide; a contact layer over and contacting the conductive layer comprising silver; another dielectric layer comprising titanium oxide; another dielectric layer comprising tin oxide; and another dielectric layer comprising silicon nitride.

In the capacitive touch panel of any of the preceding five paragraphs, the multi-layer transparent conductive coating may comprise, moving away from the substrate, a dielectric layer comprising zinc oxide; a conductive layer comprising silver directly contacting the dielectric layer comprising zinc oxide; a contact layer over and contacting the conductive layer comprising silver; a dielectric layer comprising silicon nitride.

In the capacitive touch panel of any of the preceding six paragraphs, the multi-layer transparent conductive coating may have a sheet resistance of less than or equal to about 15 ohms/square, more preferably less than or equal to about 10 ohms/square, and most preferably less than or equal to about 5 ohms/square.

The capacitive touch panel of any of the preceding seven paragraphs may be coupled to a liquid crystal (LC) panel, the liquid crystal panel including a pair of substrates with a liquid crystal layer provided therebetween, and wherein the multi-layer transparent conductive coating is provided between said substrate and the liquid crystal panel, and wherein the multi-layer transparent conductive coating is adjacent an air gap that is provided between the liquid crystal panel and the multi-layer transparent conductive coating.

In certain example embodiments of this invention, there is provided a method of manufacturing a touch panel comprising a substrate and a signal processor, the method comprising: sputter-depositing a multi-layer silver-inclusive transparent conductive coating on the substrate and patterning the silver-inclusive transparent conductive coating to form a plurality of conductive electrodes and a plurality of conductive traces, wherein the plurality of electrodes and the plurality of traces are in a plane substantially parallel to the substrate, wherein each of the electrodes is electrically connected to the signal processor by at least one of the traces, and wherein there is no more than a 2.0 (more preferably 1.5, and most preferably 1.0) difference in the visible range from 550-600 nm between (a) a glass side and/or film side visible reflectance percentage of the multi-layer transparent conductive coating on the substrate in areas where the coating is present, and (b) a visible reflectance percentage of the substrate in at least some areas where the multi-layer transparent conductive coating is not present.

In the method of the immediately preceding paragraph, the substrate may be a glass substrate or a substrate made up of glass coated with an antireflective (AR) coating.

In the method of any of the preceding two paragraphs, the multi-layer transparent conductive coating may comprise, moving away from the substrate: a first dielectric layer comprising titanium oxide; another dielectric layer comprising zinc oxide; a conductive layer comprising silver directly contacting the dielectric layer comprising zinc oxide; a contact layer over and contacting the conductive layer comprising silver; another dielectric layer comprising titanium oxide; another dielectric layer comprising tin oxide; and another dielectric layer comprising silicon nitride. Optionally, the contact layer may comprise an oxide of Ni and/or Cr. The first dielectric layer comprising titanium oxide may have a thickness of from 130-185 angstroms (more preferably from about 150-185 angstroms), and/or the dielectric layer comprising silicon nitride may have a thickness of from 300-400 angstroms (more preferably from 300-320 angstroms).

In the method of any of the preceding three paragraphs, the multi-layer transparent conductive coating may have a sheet resistance of less than or equal to about 15 ohms/square, more preferably less than or equal to about 10 ohms/square, and most preferably less than or equal to about 5 ohms/square.

In the method of any of the preceding four paragraphs, the method may include providing a display panel that is coupled to the substrate with an air gap therebetween, wherein the multi-layer transparent conductive coating is adjacent the air gap.

In example embodiments of this invention (e.g., see the coated article in FIG. 4(c)), there is provided a coated article comprising a multi-layer coating on glass, the multi-layer coating comprising, moving away from the glass: (i) an antireflective (AR) portion comprising: a first high refractive index dielectric layer; a first low refractive index dielectric layer; a second high refractive index dielectric layer; a second low refractive index dielectric layer, wherein the second high refractive index layer is located between and contacting the first and second low refractive index dielectric layers, and the first low refractive index dielectric layer is located between and contacting the first and second high refractive index layers; the first and second high refractive index dielectric layers having a refractive index (n) of at least about 2.15 at 550 nm; the first and second low refractive index dielectric layers having a refractive index (n) of no greater than about 1.7 at 550 nm; and a dielectric layer comprising metal oxide; (ii) a portion including a conductive layer comprising: a dielectric layer comprising silicon nitride; a dielectric layer comprising zinc oxide; a conductive layer comprising silver directly contacting the dielectric layer comprising zinc oxide; a contact layer over and contacting the conductive layer comprising silver; and a dielectric layer comprising silicon nitride.

In the coated article of the immediately preceding paragraph, the dielectric layer comprising metal oxide may comprise or consist essentially of an oxide of zirconium.

In the coated article of any of the preceding two paragraphs, the first and second low refractive index dielectric layers may comprise oxide of silicon.

In the coated article of any of the preceding three paragraphs, the first and second high refractive index dielectric layers may comprise an oxide of titanium and/or an oxide of niobium.

In the coated article of any of the preceding four paragraphs, it may be the case that there is no more than a 2.0 (more preferably no more than 1.5, and most preferably no more than 1.0) difference in a range from 550-600 nm between (a) a glass side visible reflectance percentage of the coating on the glass in an area where the coating is present on the glass, and (b) a glass side visible reflectance percentage of the glass in an area where only the antireflective (AR) portion (i), but not the portion (ii), is present on the glass.

The coated article of any of the preceding five paragraphs may be coupled to a display panel with an air gap therebetween, wherein the coating may be adjacent the air gap so as to be located between the glass and the air gap.

The conductive coatings herein, in any of the various embodiments discussed above and/or in the figures, may be used for conductors and/or electrodes in various electronic devices including but not limited to one or more of touch panels, shower controls on tile or doors, elevator controls, signs,/maps such as in airports or vehicles, location mapping systems such as for tracking person(s) of interest, mapping devices, elevator controls, sensors, providing personal interaction for museum exhibits or schools (e.g., via buttons), automotive controls such as for wipers or climate control or stereo control, door entry devices for residential or automotive applications such as in a touch-keypad or smartphone controller, touch teaching devices, selecting products in vending machines, automotive windshield collision detection systems, interactive storefronts, rain/humidity sensors, glass tables with controls thereon, cooktop controls, music keyboards, remote control devices, sign/map with transparent projector screen, restaurant menu devices, window blind systems, microwave controls, washer/dryer controls such as flush touch panel controls on a surface thereof, touch controlled PDLC/electrochromic device grid pattern, room light switch replacement, electronic marker boards, and/or thermostat controls.

Such applications may include binary and/or positional touch-sensitive functionality; may be provided in horizontal, vertical, or other orientations; maybe used in consumer, industrial, office, appliance, residential, educational, and/or other environments; etc.

The forgoing exemplary embodiments are intended to provide an understanding of the disclosure to one of ordinary skill in the art. The forgoing description is not intended to limit the inventive concept described in this application, the scope of which is defined in the following claims.

What is claimed is:

1. A capacitive touch panel, comprising:
    a multi-layer transparent conductive coating supported by a substrate,
    wherein the multi-layer transparent conductive coating comprises at least one conductive layer comprising silver located between at least a first dielectric layer and a second dielectric layer,
    wherein the multi-layer transparent conductive coating, comprising at least the conductive layer comprising silver located between at least the first dielectric layer and the second dielectric layer, is patterned into a plurality of electrodes and/or conductive traces for the touch panel;
    a processor configured to measure capacitance in detecting touch position regarding the touch panel; and
    wherein there is no more than a 2.0 difference at 600 nm between (a) a glass side visible reflectance percentage of the multi-layer transparent conductive coating on the substrate in at least some areas where the coating is present, and (b) a visible reflectance percentage of the substrate in at least some areas where the multi-layer transparent conductive coating is not present.

2. The capacitive touch panel of claim 1, wherein the substrate is a glass substrate.

3. The capacitive touch panel of claim 1, wherein there is no more than a 1.5 difference at 600 nm between (a) a glass side visible reflectance percentage of the multi-layer transparent conductive coating on the substrate in at least some areas where the coating is present, and (b) a visible reflectance percentage of the substrate in at least some areas where the multi-layer transparent conductive coating is not present.

4. The capacitive touch panel of claim 1, wherein there is no more than a 1.0 difference at 600 nm between (a) a glass side visible reflectance percentage of the multi-layer transparent conductive coating on the substrate in at least some areas where the coating is present, and (b) a visible reflectance percentage of the substrate in at least some areas where the multi-layer transparent conductive coating is not present.

5. The capacitive touch panel of claim 1, wherein the first dielectric layer comprises titanium oxide.

6. The capacitive touch panel of claim 1, wherein the second dielectric layer comprises tin oxide.

7. The capacitive touch panel of claim 1, wherein the multi-layer transparent conductive coating comprises, moving away from the substrate:
    a dielectric layer comprising titanium oxide;
    another dielectric layer comprising zinc oxide;
    the conductive layer comprising silver directly contacting the dielectric layer comprising zinc oxide;
    a contact layer over and contacting the conductive layer comprising silver;
    another dielectric layer comprising titanium oxide;
    another dielectric layer comprising tin oxide; and
    another dielectric layer comprising silicon nitride.

8. The capacitive touch panel of claim 1, wherein the multi-layer transparent conductive coating has a sheet resistance of less than or equal to about 15 ohms/square.

9. The capacitive touch panel of claim 1, wherein the multi-layer transparent conductive coating has a sheet resistance of less than or equal to about 10 ohms/square.

10. The capacitive touch panel of claim 1, wherein the multi-layer transparent conductive coating has a sheet resistance of less than or equal to about 5 ohms/square.

* * * * *